(12) United States Patent
Karasawa et al.

(10) Patent No.: US 6,730,974 B2
(45) Date of Patent: May 4, 2004

(54) SEMICONDUCTOR DEVICES, MEMORY SYSTEMS AND ELECTRONIC APPARATUSES WITH IMPROVED LATCH UP SUPPRESSION

(75) Inventors: Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/150,498

(22) Filed: May 16, 2002

(65) Prior Publication Data
US 2002/0190292 A1 Dec. 19, 2002

(30) Foreign Application Priority Data
May 16, 2001 (JP) ........................ 2001-146348

(51) Int. Cl.[7] .................. H01L 29/76; H01L 29/94; H01L 31/062; H01L 31/113; H01L 31/119
(52) U.S. Cl. ........................ 257/393; 257/903
(58) Field of Search .................. 257/393, 903

(56) References Cited
U.S. PATENT DOCUMENTS 5,334,863 A * 8/1994 Ohkawa et al. ............ 257/69
5,640,027 A * 6/1997 Shin et al. .................. 257/207
6,030,865 A * 2/2000 Hashimoto et al. ......... 438/238
6,404,023 B1 * 6/2002 Mori et al. ................. 257/393

* cited by examiner

Primary Examiner—Long Pham
Assistant Examiner—Howard Weiss
(74) Attorney, Agent, or Firm—Hogan & Hartson, LLP

(57) ABSTRACT

Semiconductor devices are provided that include a memory cell having load transistors, driver transistors, and transfer transistors. The semiconductor device has a first element-forming region that can be provided in, for example, a p-well region. The first element-forming region can include includes a first active region, a second active region, a third active region, a fourth active region and a fifth active region. The third active region, the fourth active region and the fifth active region can be provided between the first active region and the second active region. The first active region and the second active region can be continuous with the third active region, the fourth active region and the fifth active region, respectively. Thus, semiconductor devices can be provided having element-forming regions that can be readily formed. Memory systems and electronic equipment that include such semiconductor devices can also be provided.

81 Claims, 18 Drawing Sheets

SEMICONDUCTOR DEVICES, MEMORY SYSTEMS AND ELECTRONIC APPARATUSES WITH IMPROVED LATCH UP SUPPRESSION

BACKGROUND OF THE INVENTION

The present invention relates to semiconductor devices, such as, Static Random Access Memories (SRAMs), and memory systems and electronic apparatuses including the same.

SRAMs are semiconductor memory devices that do not require a refreshing operation. Therefore, SRAMs can simplify the system and lower power consumption, and are widely used as memories for electronic equipment, such as mobile phones.

Accordingly, there is a need for improved SRAM devices in which processing can be simplifed.

SUMMARY OF THE PREFERRED EMBODIMENTS

Aspects of the present invention can provide semiconductor devices including a memory cell. Such semiconductor devices can include, for example, a first element-forming region provided in a first conductivity type well region. The first element-forming region can include a first active region, a second active region, a third active region, a fourth active region, and a fifth active region. The third active region, the fourth active region and the fifth active region can be provided between the first active region and the second active region. The first active region and the second active region can be continuous with the third active region, the fourth active region and the fifth active region, respectively.

Other aspects of the present invention can provide memory systems and electronic apparatuses including such semiconductor devices.

BRIEF DESCRIPTION OF DRAWINGS

The following discussion may be best understood with reference to the various views of the drawings, described in summary below, which form a part of this disclosure.

DETAILED DESCRIPTION OF THE PREFERRED EMBODIMENTS

Figure 1:
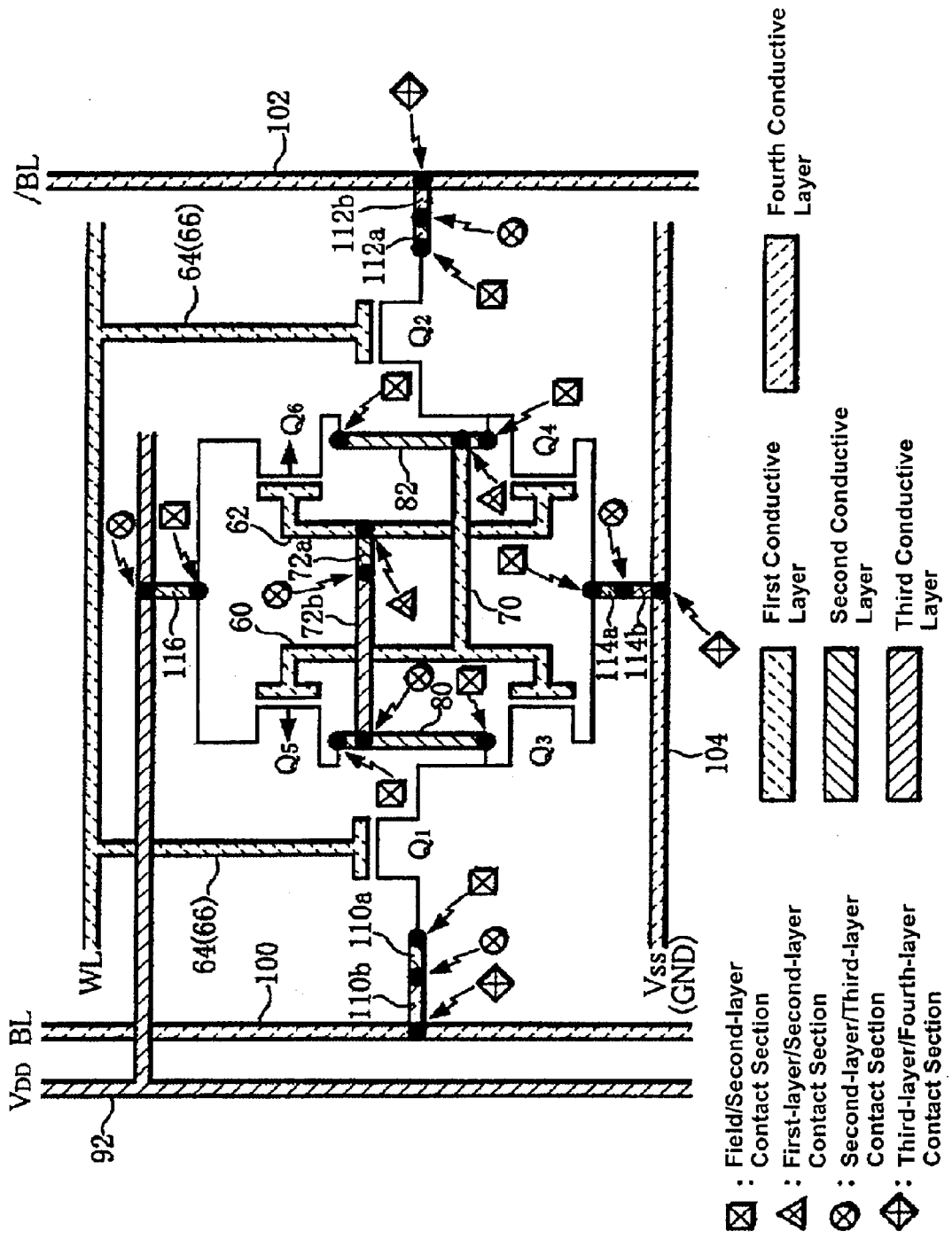
FIG. 1 shows an equivalent circuit of an SRAM in accordance with aspects of the present invention.

Aspects of the present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of functional units is exaggerated for clarity. Like numbers refer to like elements throughout.

The terms "first conductivity type" and "second conductivity type" can refer to opposite conductivity types, such as P-type or N-type. Moreover, each embodiment described and illustrated herein includes its complementary conductivity type embodiment as well.

It will be understood that when an element such as layer, region, or substrate is referred to as being "connected to" another element, it can be directly connected to the other element or intervening elements may also be present. In contrast, when an element is referred to as being "directly connected to" another element, there are no intervening elements present. When an element such as layer, region, or substrate is referred to as being "adjacent" another element, it can be near the other element but not necessarily independent of the other element. When an element such as layer, region, or substrate is referred to as being "between" two things, it can be either partly of completely between those two things, but is not necessarily completely and continuously between those two things. The term "adapted to" should be construed to mean "capable of".

Practice of preferred aspects of the present invention can provide semiconductor devices whose element-forming regions can be readily formed as well as memory systems and electronic apparatuses that include such semiconductor devices.

Particularly preferred embodiments of the invention can provide a semiconductor device that can include a memory cell including a first load transistor, a second load transistor, a first driver transistor, a second driver transistor, a first transfer transistor, and a second transfer transistor. The semiconductor device can include a first conductive type well region extending along a first direction and a word line extending along the first direction over the first conductive type well. The semiconductor device may also include a first element-forming region provided in the first conductive type well region, wherein the first element-forming region includes a first active region, a second active region, a third active region, a fourth active region, and a fifth active region. The third active region, the fourth active region and the fifth active region can be provided between the first active region and the second active region. The first active region and the second active region can be continuous with the third active region, the fourth active region and the fifth active region, respectively. The first active region and the second active region are preferably continuous with the third active region, the fourth active region and the fifth active region, respectively.

Accordingly, the active regions need not be isolated from one another in the first element-forming region. As a result, patterning to form the first element-forming region can be readily conducted, and the first element-forming region can be readily formed.

Numerous embodiments can be implemented in the semiconductor device in accordance with aspects of the present invention.

For example, in some embodiments, the first active region and the second active region extend along the first direction, and the third active region, the fourth active region and the fifth active region can extend along a second direction.

In other embodiments, the third active region, the fourth active region and the fifth active region can be successively arranged in the first direction.

In still other embodiments, a well contact region for the first conductive type well region can be formed in the first element-forming region. This can be particularly useful when a well contact region for a first conductive type well region is formed.

In other embodiments, the first element-forming region can be part of a first memory cell, a second memory cell, a third memory cell and a fourth memory cell.

In such embodiments, a first driver transistor in the first memory cell and a second driver transistor in the second memory cell may be formed in the first active region, a second driver transistor in the third memory cell and a first driver transistor in the fourth memory cell may be formed in the second active region, a second transfer transistor in the second memory cell and a second transfer transistor in the third memory cell may be formed in the third active region, and a first transfer transistor in the first memory cell and a first transfer transistor in the fourth memory cell may be formed in the fifth active region.

In some instances, a well contact region for the first conductive type well region may be formed in the first element-forming region, and the well contact region may be formed in the fourth active region.

When the well contact region is formed in the fourth active region, a first source of each of the driver transistors in the first memory cell and the second memory cell, and a second source of each of the driver transistors in the third memory cell and the fourth memory cell may be provided in the fourth active region, and the well contact region may be provided between the first source and the second source.

In some instances, the well contact region, the first source and the second source may be electrically connected to a Vss wiring. In this case, since the well contact region is electrically connected to the Vss wiring, a well potential of a p-well can be fixed at Vss, and thus generation of latch up can be suppressed.

In still other embodiments, the word line can be formed in a manner to cross the first element-forming region.

In other embodiments, the semiconductor device above may comprise a first gate-gate electrode layer including a gate electrode of the first load transistor and a gate electrode of the first driver transistor; a second gate-gate electrode layer including a gate electrode of the second load transistor and a gate electrode of the second driver transistor; a first drain-drain wiring layer that forms a part of a connection layer that electrically connects a drain of the first load transistor and a drain of the first driver transistor; a second drain-drain wiring layer that forms a part of a connection layer that electrically connects a drain of the second load transistor and a drain of the second driver transistor; a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

Now, further discussion of preferred aspects of a semiconductor device having element-forming regions that can be readily formed is provided with reference to the accompanying drawings. This discussion will discuss an example in which a semiconductor device embodying at least some of the preferred aspects of the present invention are implemented as a Static Random Access Memory (SRAM), although implementation of these preferred aspects of the present invention are not necessarily limited to SRAM devices but may also apply to other types of semiconductor devices. Such semiconductor devices can be implemented in, for example, memory systems and/or other electronic apparatuses.

1. Equivalent Circuit of SRAM

FIG. 1 shows an equivalent circuit of an SRAM in accordance with embodiments that implement aspects of the present invention.

The SRAM includes memory cells formed with six MOS field effect transistors. One CMOS inverter can be formed with an n-channel type driver transistor Q3 and a p-channel type load transistor Q5. Another CMOS inverter can be formed with an n-channel type driver transistor Q4 and a p-channel type load transistor Q6. These two CMOS inverters can be cross-coupled to form a flip-flop. Further, one memory cell can be formed from this flip-flop and n-channel type transfer transistors Q1 and Q2.

2. Structure of Memory Cell Array of SRAM

Referring to FIGS. 2–14, a structure of a memory cell array of the SRAM will be described. FIGS. 2–11 show four memory cells MC1–MC4. In the particular embodiment shown in FIG. 2, a memory cell array is shown in which four memory cells in a unit are provided. The memory cell arrays can be arranged repeatedly.

Figure 2:
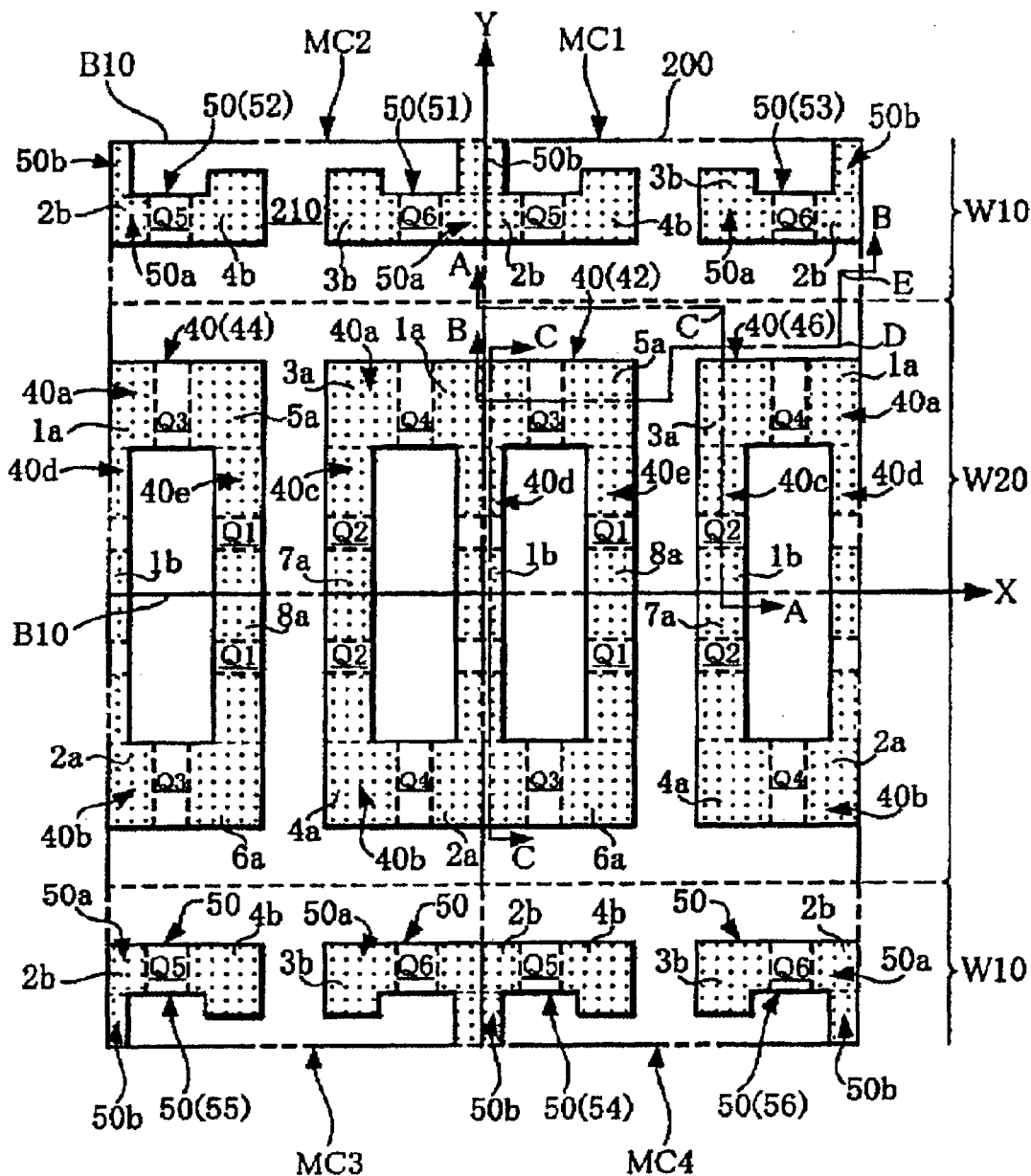
FIG. 2 schematically shows a plan view of a field of a memory cell array of the SRAM in accordance with aspects of the present embodiment.
Figure 3:
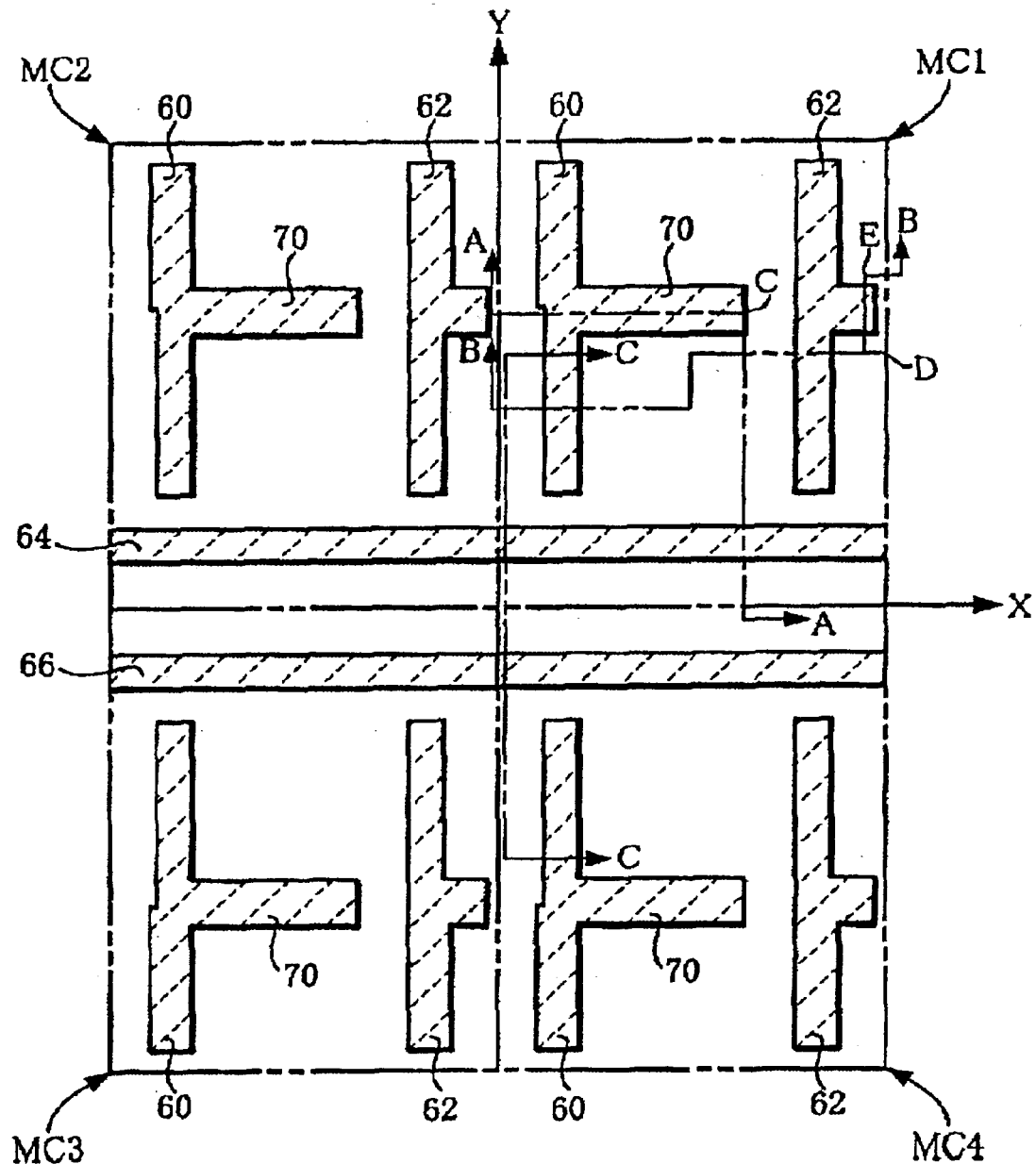
FIG. 3 schematically shows a plan view of a first conductive layer of the memory cell array of the SRAM in accordance with aspects of the present embodiment.
Figure 4:
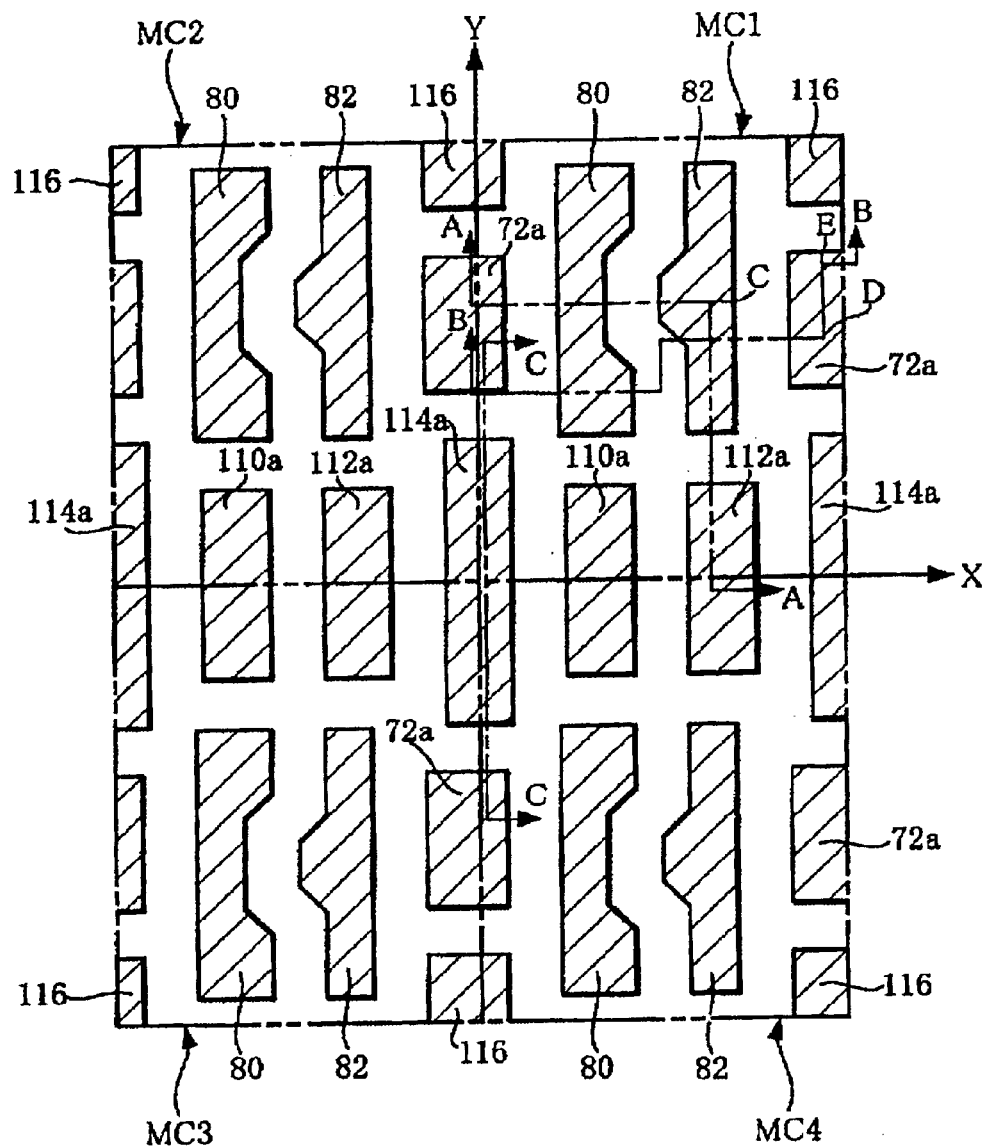
FIG. 4 schematically shows a plan view of a second conductive layer of the memory cell array of the SRAM in accordance with aspects of the present embodiment.
Figure 5:
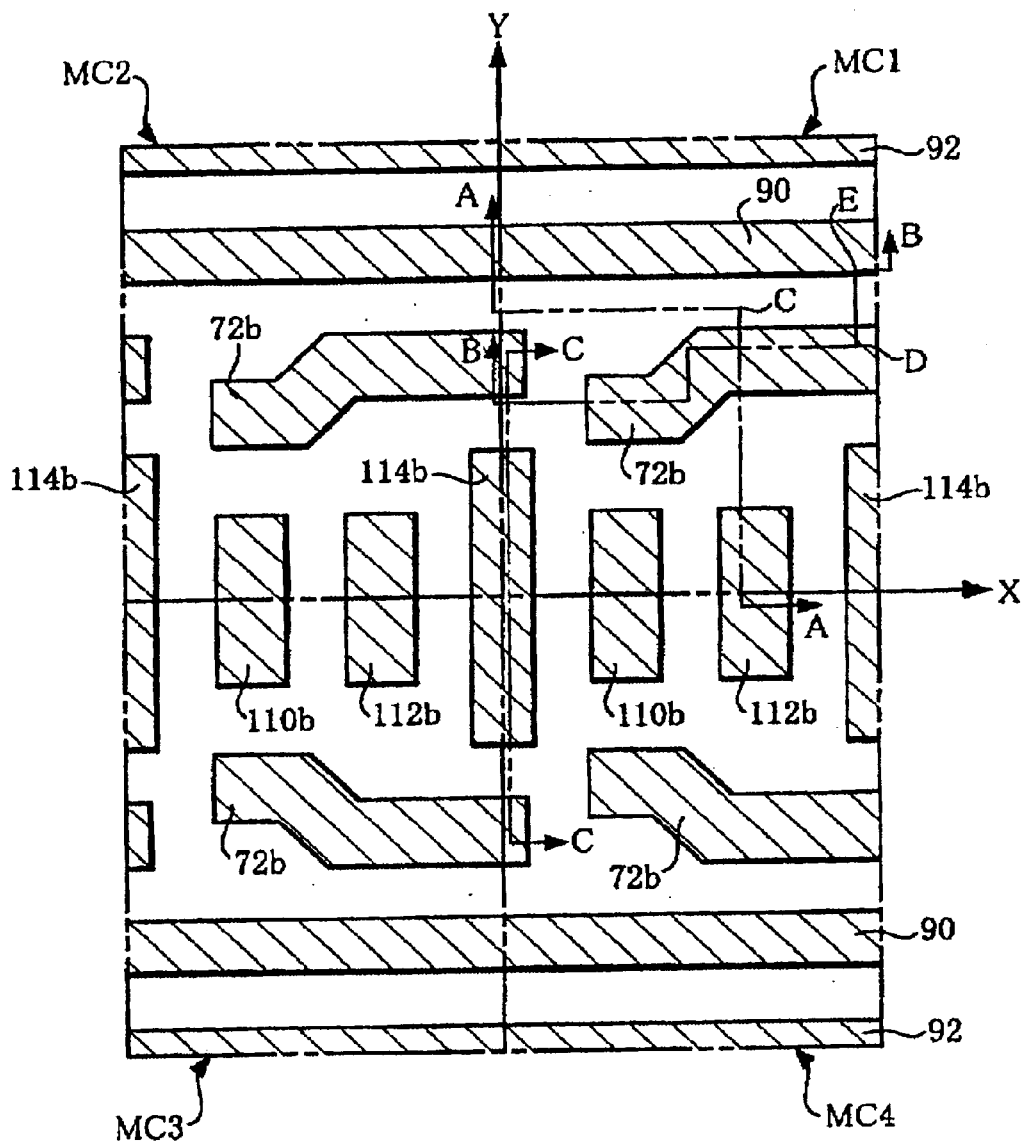
FIG. 5 schematically shows a plan view of a third conductive layer of the memory cell array of the SRAM in accordance with aspects of the present embodiment.
Figure 6:
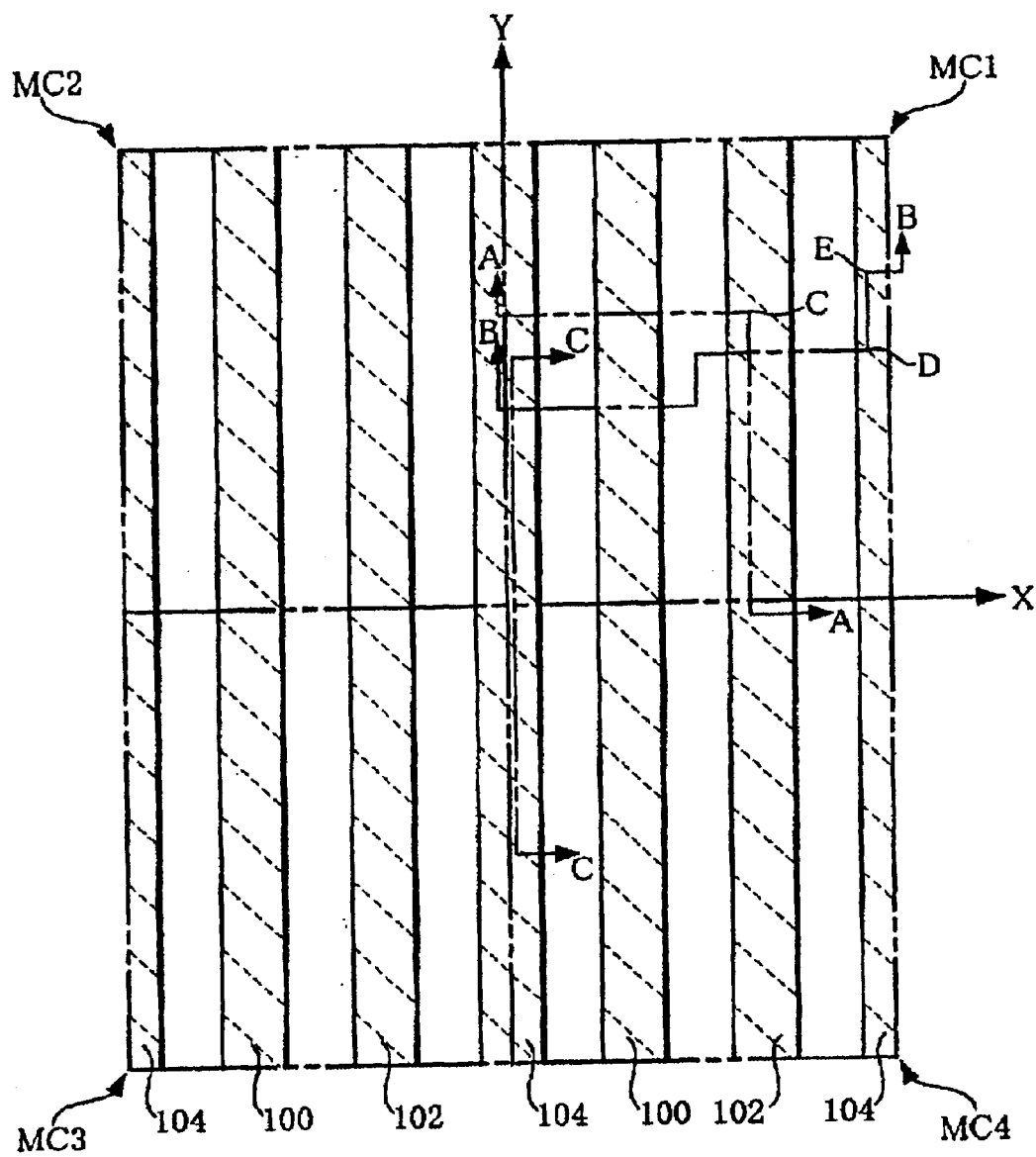
FIG. 6 schematically shows a plan view of a fourth conductive layer of the memory cell array of the SRAM in accordance with aspects of the present embodiment.
Figure 7:
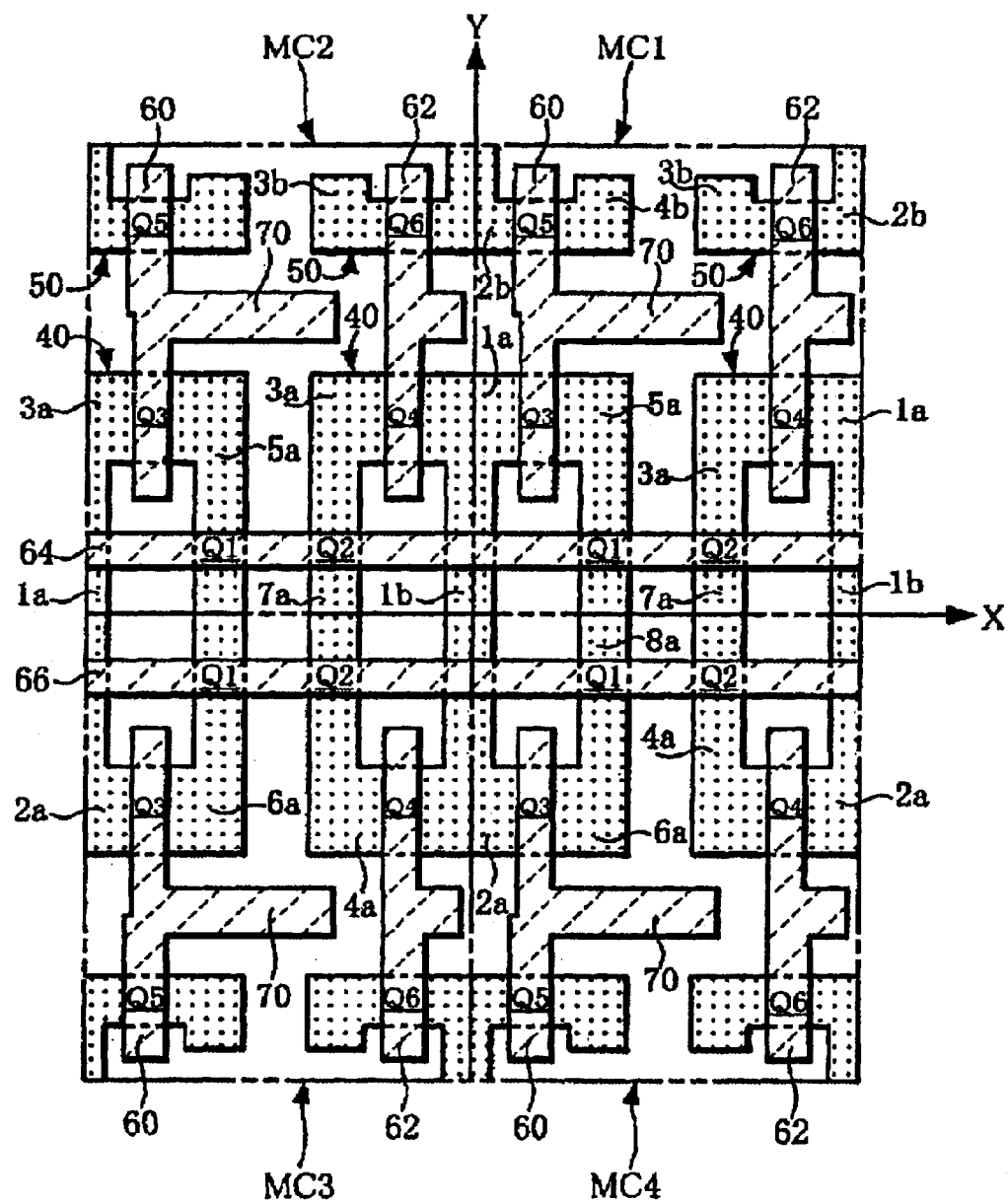
FIG. 7 schematically shows a plan view of the field and the first conductive layer of the memory cell array of the SRAM in accordance with aspects of the present embodiment.
Figure 8:
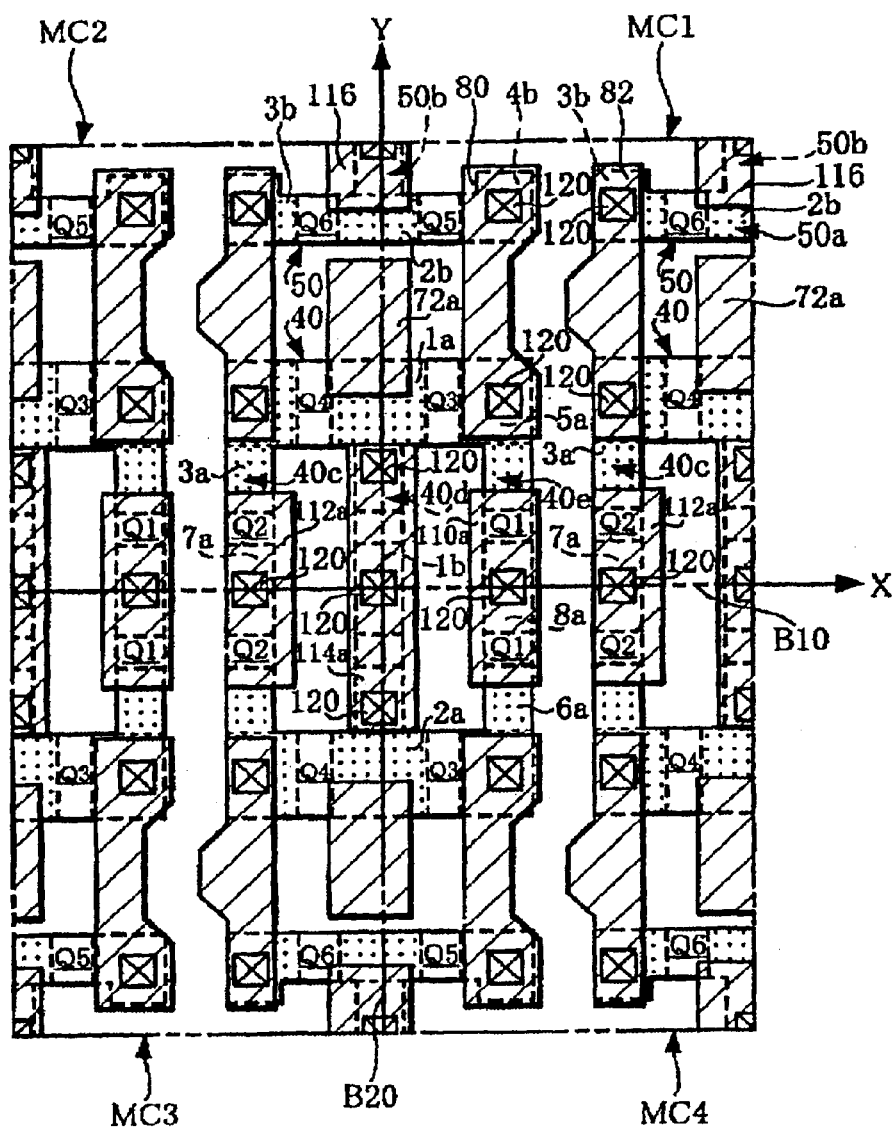
FIG. 8 schematically shows a plan view of the field and the second conductive layer of the memory cell array of the SRAM in accordance with aspects of the present embodiment.
Figure 9:
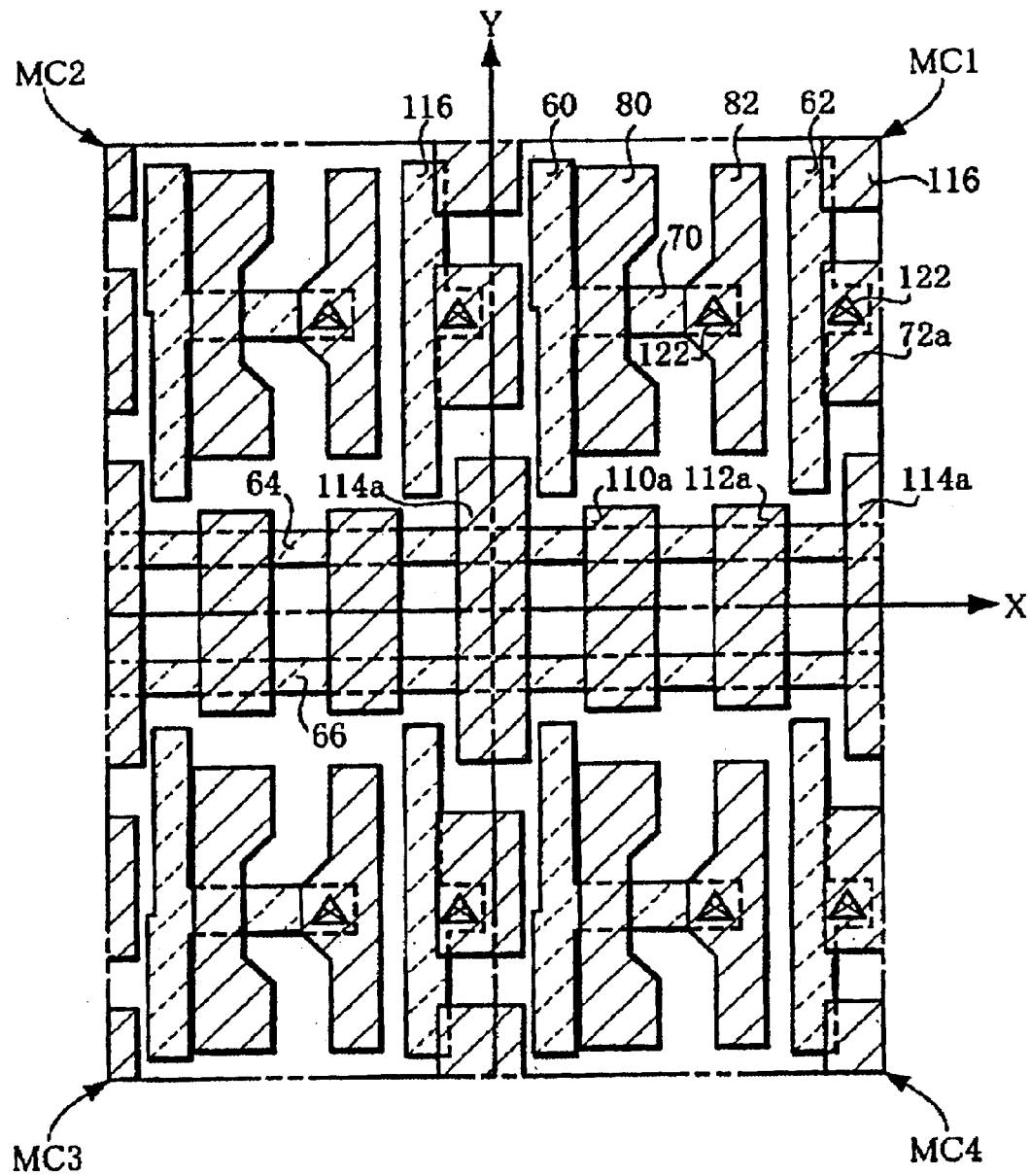
FIG. 9 schematically shows a plan view of the first conductive layer and the second conductive layer of the memory cell array of the SRAM in accordance with aspects of the present embodiment.
Figure 10:
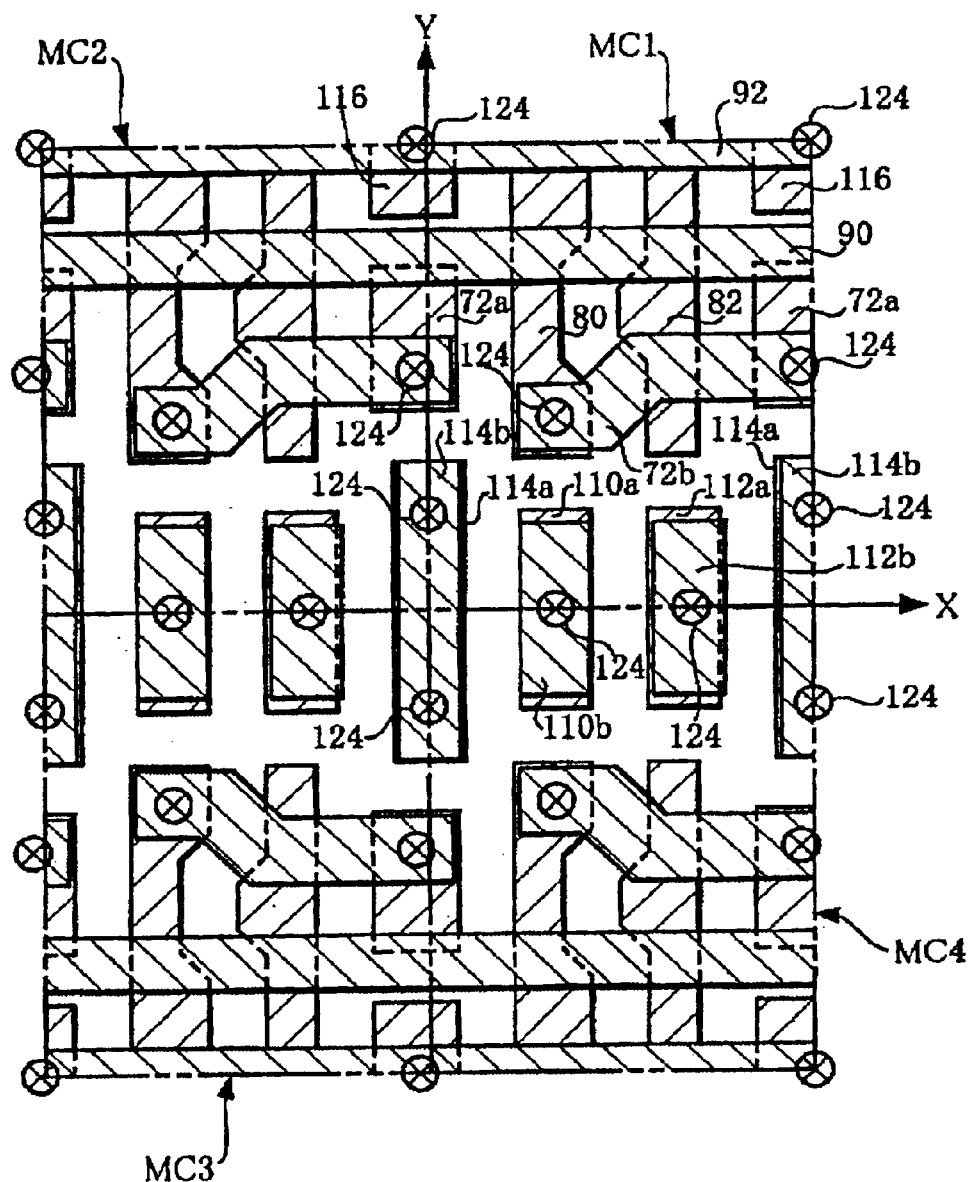
FIG. 10 schematically shows a plan view of the second conductive layer and the third conductive layer of the memory cell array of the SRAM in accordance with aspects of the present embodiment.
Figure 11:
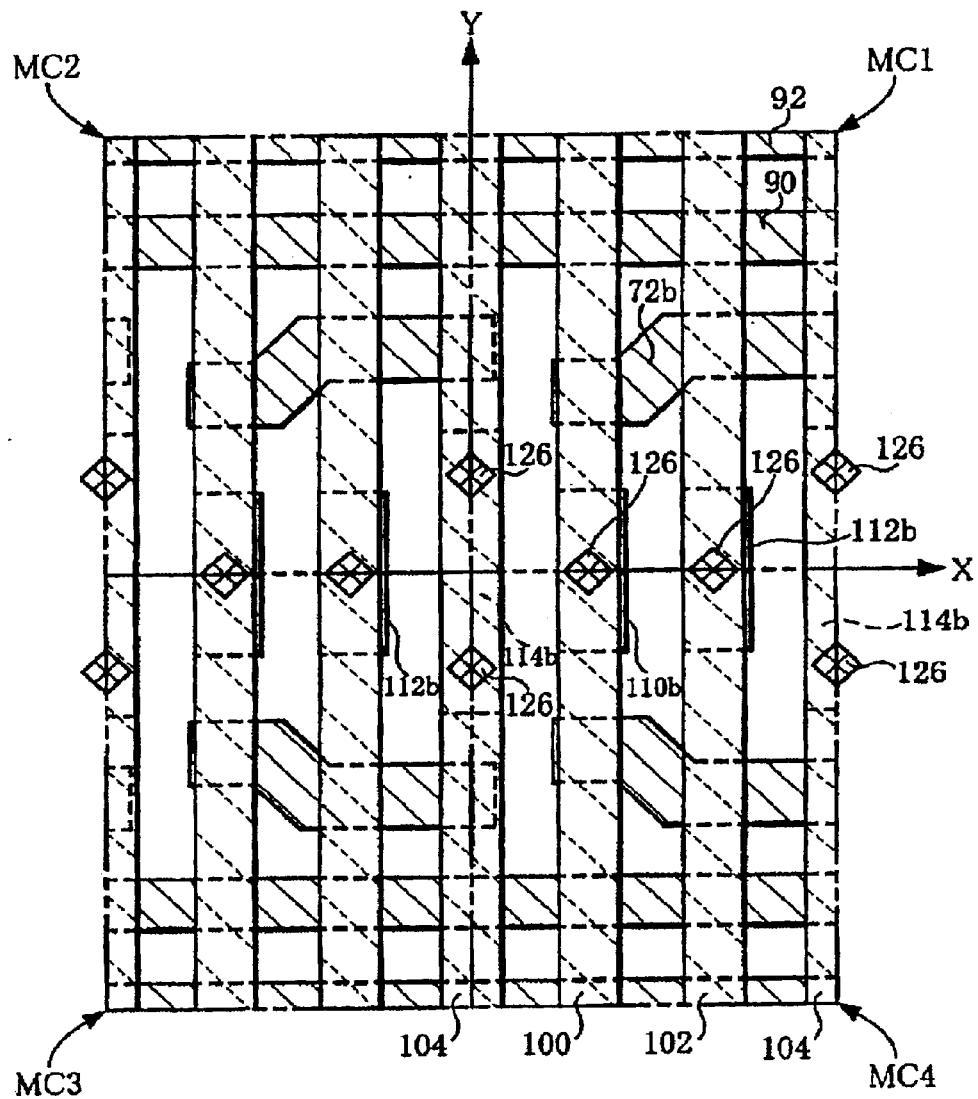
FIG. 11 schematically shows a plan view of the third conductive layer and the fourth conductive layer of the memory cell array of the SRAM in accordance with aspects of the present embodiment.
Figure 12:
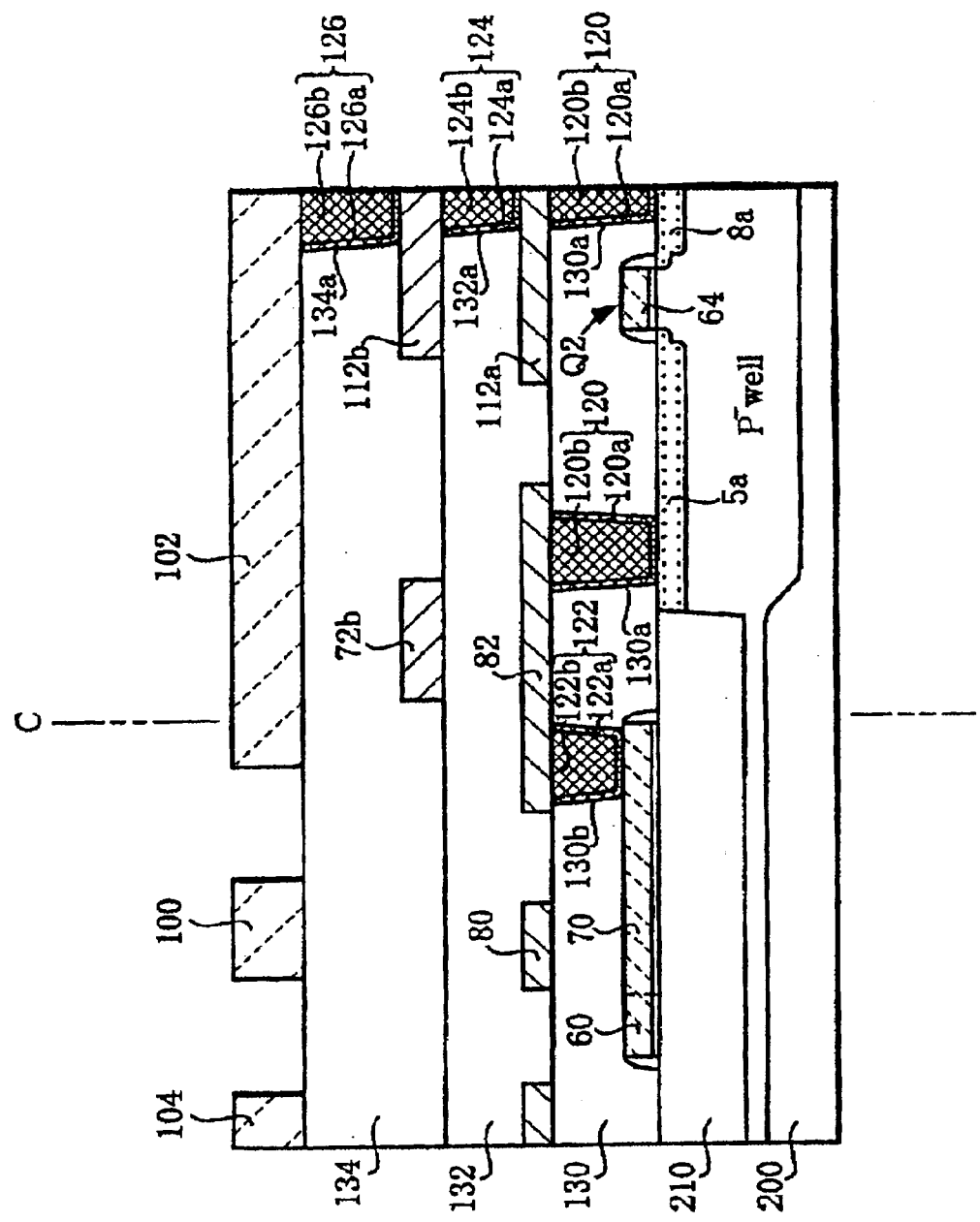
FIG. 12 schematically shows a cross-sectional view taken along a line A—A shown in FIG. 2–FIG. 6.
Figure 13:
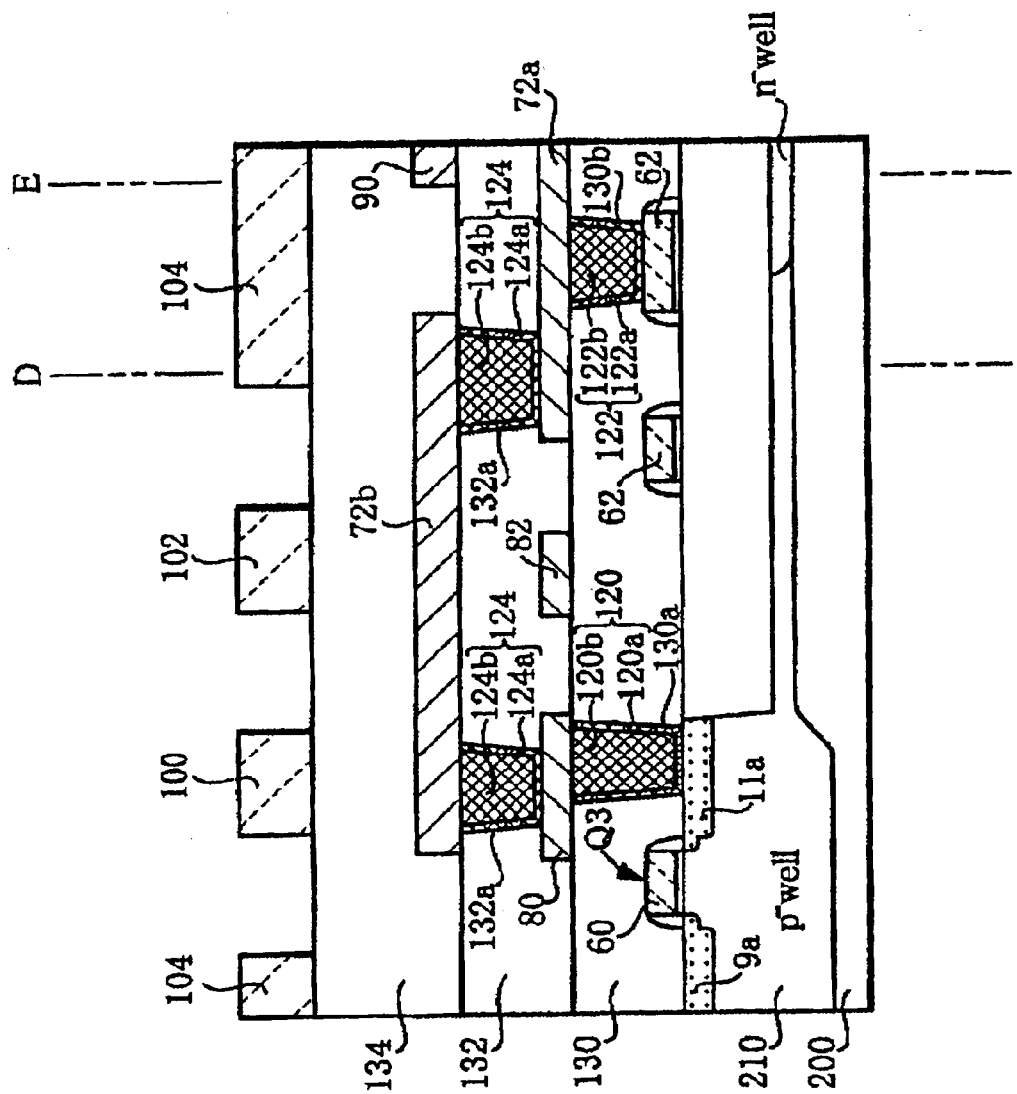
FIG. 13 schematically shows a cross-sectional view taken along a line B—B shown in FIG. 2–FIG. 6.
Figure 14:
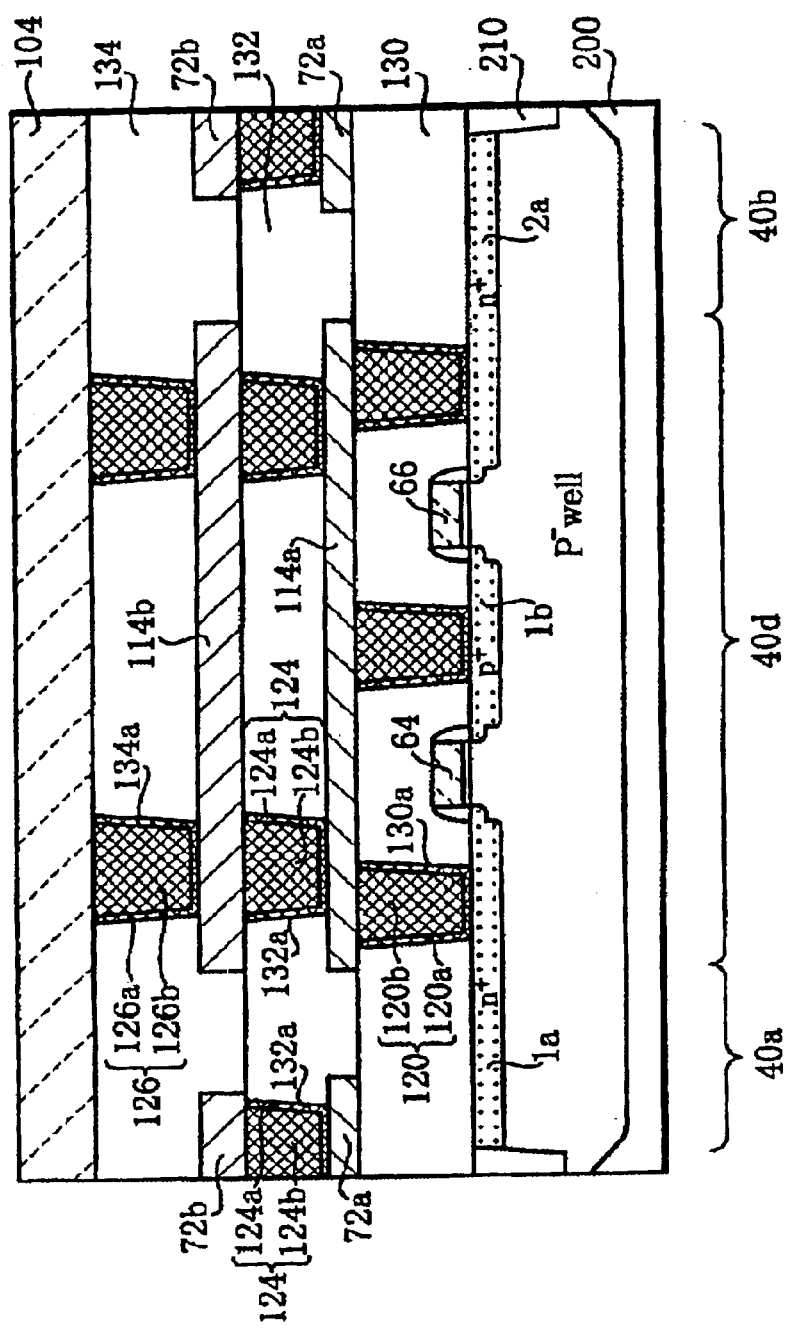
FIG. 14 schematically shows a cross-sectional view taken along a line C—C shown in FIG. 2–FIG. 6.

FIG. 2 schematically shows a plan view of a field of an SRAM memory cell array. FIG. 3 schematically shows a plan view of a first conductive layer of the SRAM memory cell array. FIG. 4 schematically shows a plan view of a second conductive layer of the memory cell array of the SRAM. FIG. 5 schematically shows a plan view of a third conductive layer of the memory cell array of the SRAM. FIG. 6 schematically shows a plan view of a fourth conductive layer of the memory cell array of the SRAM. FIG. 7 schematically shows a plan view of the field and the first conductive layer of the memory cell array of the SRAM. FIG. 8 schematically shows a plan view of the field and the second conductive layer of the memory cell array of the SRAM. FIG. 9 schematically shows a plan view of the first conductive layer and the second conductive layer of the memory cell array of the SRAM. FIG. 10 schematically shows a plan view of the second conductive layer and the third conductive layer of the memory cell array of the SRAM. FIG. 11 schematically shows a plan view of the third conductive layer and the fourth conductive layer of the memory cell array of the SRAM. FIG. 12 schematically shows a cross-sectional view taken along a line A—A shown in FIG. 2–FIG. 11. FIG. 13 schematically shows a cross-sectional view taken along a line B—B shown in FIG. 2–FIG. 11. FIG. 14 schematically shows a cross-sectional view taken along a line C—C shown in FIG. 2–FIG. 11.

The SRAM can be formed with an element-forming region formed in a field, a first conductive layer, a second conductive layer, a third conductive layer, and a fourth conductive layer included therein. The structure of each of the field, and the first through fourth conductive layers will be described in detail below.

2.A. Field

A structure of a field will now be described with reference to FIG. 2.

N-well regions W10 and p-well regions W20 can be formed in a semiconductor substrate 200. The n-well regions W10 and the p-well regions W20 can be formed in a manner to extend along an X direction.

A plurality of first element-forming regions 40 can be formed in the p-well region W20. The plurality of first element-forming regions 40 can be successively formed at predetermined intervals in the X direction. Also, each of the first element-forming regions 40 can be formed in a manner to cross a boundary line B10 of the memory cells extending in the X direction and a boundary line B20 of the memory cells extending in the Y direction. Accordingly, each of the first element-forming regions 40 can be formed in a manner to belong to four memory cells. The first element-forming regions 40 can be defined by element isolation regions (for example, trench element isolation regions, LOCOS element isolation regions, etc.) 210.

A plurality of second element-forming regions 50 can be formed in the n-well region W10. The plurality of second element-forming regions 50 can be successively formed at predetermined intervals in the X direction. Also, each of the second element-forming regions 50 can be formed in a manner to cross the boundary line B20 of the memory cells extending in the Y direction. The second element-forming regions 50 can be defined by the element isolation regions 210.

The first and second element-forming regions 40 and 50 in the first and second memory cells MC1 and MC2 can be symmetrical in relation with respect to the first and second element-forming regions 40 and 50 in the third and fourth memory cells MC3 and MC4.

The first and second element-forming regions 40 and 50 in the first and fourth memory cells MC1 and MC4 can be symmetrical in relation with respect to the first and second element-forming regions 40 and 50 in the second and third memory cells MC2 and MC3.

In this manner, the first-fourth memory cells MC1–MC4 as a unit can be repeated in the layout.

Also, a left half of the first and second element-forming regions 40 and 50 in each of the memory cells MC can be in a symmetrical relation with respect to a right half of the first and second element-forming regions 40 and 50 in that memory cell MC.

The first element-forming region 40 and the second element-forming region 50 will be described in greater detail below.

2.A.1 First Element-Forming Region

The first element-forming regions 40 will now be described with reference to FIG. 15. Each of the first element-forming regions 40 can be formed from a first active region 40a and a second active region 40b extending in the X direction, and a third active region 40c, a fourth active region 40d and a fifth active region 40e extending in the Y direction.

The third active region 40c, the fourth active region 40d and the fifth active region 40e can be successively arranged in the X direction. The fourth active region 40d can be formed such that it crosses the boundary line B20 of the memory cells that extend in the Y direction.

The first active region 40a can be continuous with end sections on one side of the third active region 40c, the fourth active region 40d and the fifth active region 40e. Also, the second active region 40b can be continuous with end sections on the other side of the third active region 40c, the fourth active region 40d and the fifth active region 40e.

The first element-forming region 40 will be described in greater detail below. Descriptions are given separately for its first element-forming region 42 at the center, first element-forming region 44 on the left side, and first element-forming region 46 on the right side.

2.A.1.a. First Element-Forming Region 42 at the Center

Figure 15:
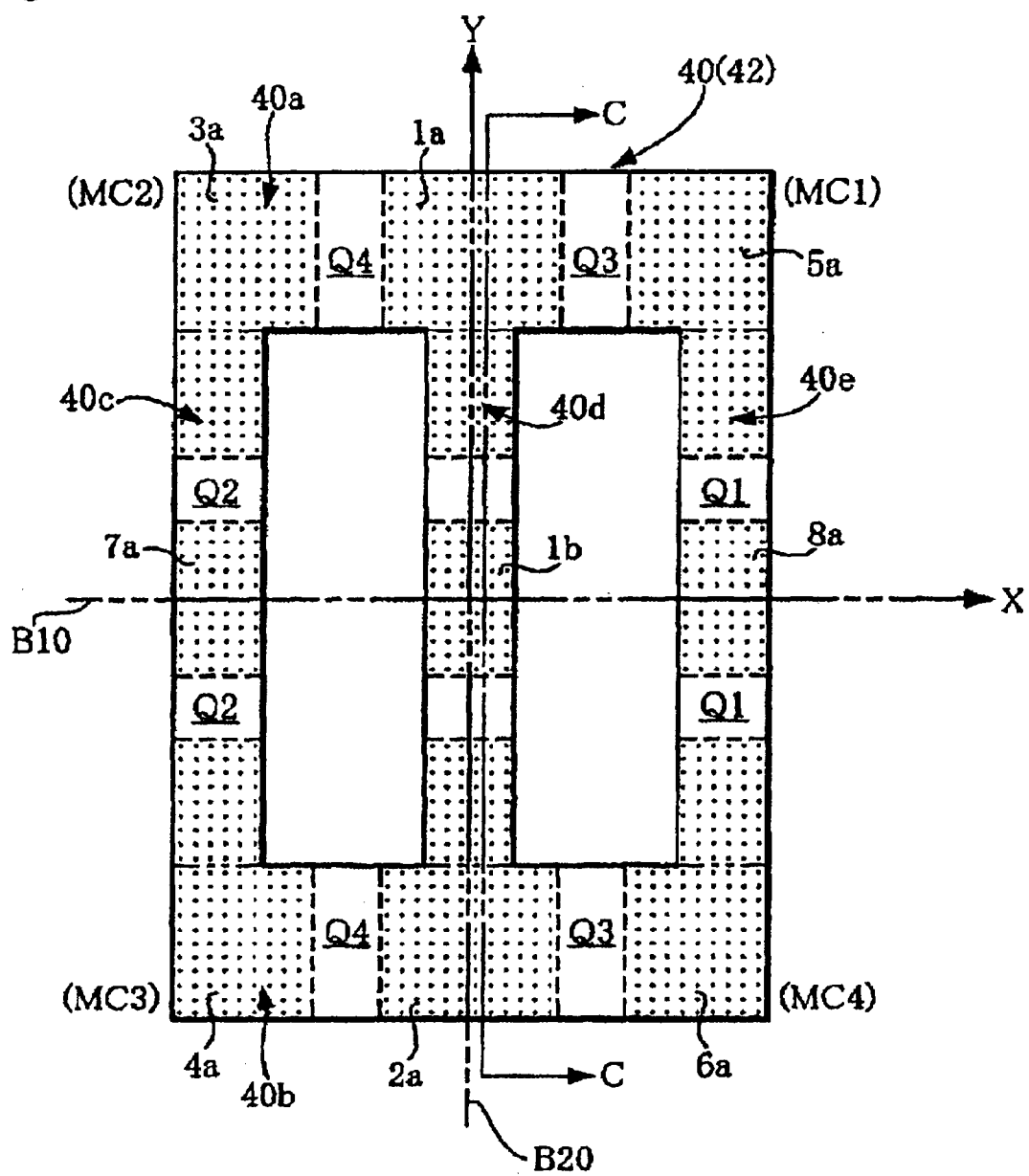
FIG. 15 shows an enlarged plan view of a first element-forming region.

Referring now to FIG. 2, FIG. 14 and FIG. 15, the first element-forming region 42 at the center will be described. FIG. 15 is an enlarged plan view of the first element-forming region 42 at the center.

The first element-forming region 42 at the center can be formed such that the region 42 can be shared by or can be part of the first memory cell MC1, the second memory cell MC2, the third memory cell MC3 and the fourth memory cell MC4.

The first element-forming region 42 in the first and second memory cells MC1 and MC2 can be symmetrical in relation with respect to the first element-forming region 42 in the third and fourth memory cells MC3 and MC4 about the boundary line B10 extending in the X direction.

Also, the first element-forming region 42 in the first and fourth memory cells MC1 and MC4 can be symmetrical in relation with respect to the first element-forming region 42 in the second and third memory cells MC2 and MC3 about the boundary line B20 extending in the Y direction.

A first driver transistor Q3 in the first memory cell MC1 and a second driver transistor Q4 in the second memory cell MC2 can be formed in the first active region 40a. A second driver transistor Q4 in the third memory cell MC3 and a first driver transistor Q3 in the fourth memory cell MC4 can be formed in the second active region 40b. A second transfer transistor Q2 in the second memory cell MC2, and a second transfer transistor Q2 in the third memory cell MC3 can be formed in the third active region 40c. A first transfer transistor Q1 in the first memory cell MC1, and a first transfer transistor Q1 in the fourth memory cell MC4 can be formed in the fifth active region 40e.

In the first element-forming region 42, a first $n^+$-type impurity layer 1a, a second $n^+$-type impurity layer 2a, a third $n^+$-type impurity layer 3a, a fourth $n^+$-type impurity layer 4a, a fifth n$^+$-type impurity layer 5a, a sixth n$^+$-type impurity layer 6a, a seventh n$^+$-type impurity layer 7a, an eighth n$^+$-type impurity layer 8a, and a first p$^+$-type impurity layer 1b can be formed.

The first n$^+$-type impurity layer 1a can be formed in part of the first active region 40a and part of the fourth active region 40d. Also, the first n$^+$-type impurity layer 1a can be formed in a manner to cross the boundary line B20 that extends in the Y direction. The first n$^+$-type impurity layer 1a can be shared by the first and second memory cells MC1 and MC2, and functions as a source of the driver transistors Q3 and Q4 in the first and second memory cells MC1 and MC2.

The second n$^+$-type impurity layer 2a can be formed in part of the second active region 40b and part of the fourth active region 40d. Also, the second n$^+$-type impurity layer 2a can be formed in a manner to cross the boundary line B20 that extends in the Y direction. The second n$^+$-type impurity layer 2a can be shared by the third and fourth memory cells MC3 and MC4, and functions as a source of the driver transistors Q4 and Q3 in the third and fourth memory cells MC3 and MC4.

The third n$^+$-type impurity layer 3a can be formed in part of the first active region 40a and part of the third active region 40c. The third n$^+$-type impurity layer 3a functions as a source or a drain of the second transfer transistor Q2 in the second memory cell MC2, and a drain of the second driver transistor Q4 in the second memory cell MC2.

The fourth n$^+$-type impurity layer 4a can be formed in part of the second active region 40b and part of the third active region 40c. The fourth n$^+$-type impurity layer 4a functions as a source or a drain of the second transfer transistor Q2 in the second memory cell MC2, and a drain of the second driver transistor Q4 in the third memory cell MC3.

The fifth n$^+$-type impurity layer 5a can be formed in part of the first active region 40a and part of the fifth active region 40e. The fifth n$^+$-type impurity layer 5a functions as a source or a drain of the first transfer transistor Q1 in the first memory cell MC1, and a drain of the first driver transistor Q3 in the first memory cell MC1.

The sixth n$^+$-type impurity layer 6a can be formed in part of the second active region 40b and part of the fifth active region 40e. The sixth n$^+$-type impurity layer 6a functions as a source or a drain of the first transfer transistor Q1 in the fourth memory cell MC4, and a drain of the first driver transistor Q3 in the fourth memory cell MC4.

The seventh n$^+$-type impurity layer 7a can be formed in part of the third active region 40c. Also, the seventh n$^+$-type impurity layer 7a can be formed between the third n$^+$-type impurity layer 3a and the fourth n$^+$-type impurity layer 4a. The seventh n$^+$-type impurity layer 7a can be shared by the second and third memory cells MC2 and MC3, and functions as a source or a drain of the transfer transistors Q2 in the second and third memory cells MC2 and MC3.

The eighth n$^+$-type impurity layer 8a can be formed in part of the fifth active region 40e. Also, the eighth n$^+$-type impurity layer 8a can be formed between the fifth n$^+$-type impurity layer 5a and the sixth n$^+$-type impurity layer 6a. The eighth n$^+$-type impurity layer 8a can be shared by the first and fourth memory cells MC1 and MC4, and functions as a source or a drain of the transfer transistors Q1 in the first and fourth memory cells MC1 and MC4.

The first p$^+$-type impurity layer 1b can be formed in part of the fourth active region 40d. The first p$^+$-type impurity layer 1b can be formed between the first n$^+$-type impurity layer 1a and the second n$^+$-type impurity layer 2a. The first p$^+$-type impurity layer 1b can be formed in a manner to belong to the first through fourth memory cells MC1–MC4. The first p+-type impurity layer 1b functions as a well contact region of a p-well.

2.A.1.b. First Element-Forming Region on the Left Side

The first element-forming region 44 on the left side will now be described below with reference to FIG. 2.

In terms of layout and function, portions of the first element-forming region 44, on the left side in the second and third memory cells MC2 and MC3, correspond to portions in the central first element-forming region 42 in the first and fourth memory cells MC1 and MC4. Accordingly, portions having the same functions can be indicated with the same reference numbers, and for sake of brevity their description can be not duplicated.

2.A.1.c. First Element-Forming Region on the Right Side

The first element-forming region 46 on the right side can be now be described below with reference to FIG. 2.

In terms of layout and function, portions of the first element-forming region 44 on the right side in the first and fourth memory cells MC1 and MC4 correspond to portions in the central first element-forming region 42 in the second and third memory cells MC2 and MC3. Again, portions having the same functions can be indicated with the same reference numbers, and for sake of brevity their description can be not duplicated.

2.A.2 Second Element-Forming Region

The second element-forming regions can be now be described below with reference to FIG. 2.

Each of the second element-forming regions 50 includes a sixth active region 50a extending in the X direction, and a seventh active region 50b extending in the Y direction. The sixth active region 50a can be formed continuously with an end section of the seventh active region 50b.

The second element-forming region 50 in the first and second memory cells MC1 and MC2 (51, 52, 53) and the second element-forming region 50 in the third and fourth memory cells MC3 and MC4 (54, 55, 56) can be now be described separately in greater detail.

2.A.2.a. Second Element-Forming Region in First and Second Memory Cells

The second element-forming region 50 in the first and second memory cells MC1 and MC2 will be described by dividing the second element-forming region 50 in the first and second memory cells MC1 and MC2 into a second element-forming region 51 at the center, a second element-forming region 52 on the left side, and a second element-forming region 53 on the right side, and then providing separate descriptions for each region.

2.A.2.a.i. The Second Element-Forming Region at the Center

The second element-forming region 51 at the center can be formed in a manner to belong to the first memory cell MC1 and the second memory cell MC2.

A first load transistor Q5 in the first memory cell MC1 and a second load transistor Q6 in the second memory cell MC2 can be formed in the sixth active region 50a.

A second p$^+$-type impurity layer 2b, a third second p$^+$-type impurity layer 3b and a fourth p$^+$-type impurity layer 4b can be formed in the second element-forming region 51.

The second p$^+$-type impurity layer 2b can be formed in part of the sixth active region 50a and the seventh active region 50b. The second p$^+$-type impurity layer 2b can be shared by the first and second memory cells MC1 and MC2, and functions as a source of the driver transistors Q5 and Q6 in the first and second memory cells MC1 and MC2.

The third p$^+$-type impurity layer 3b can be formed in the sixth active region 50a in the second memory cell MC2. The third p⁺-type impurity layer 3b functions as a drain of the second driver transistor Q6 in the second memory cell MC2.

The fourth p⁺-type impurity layer 4b can be formed in the sixth active region 50a in the first memory cell MC1. The fourth p⁺-type impurity layer 4b functions as a drain of the first driver transistor Q5 in the first memory cell MC1.

2.A.2.a.ii. The Second Element-Forming Region on the Left Side

Next, the second element-forming region 52 on the left side in the first and second memory cells MC1 and MC2 will now be described.

In terms of layout and function, the second element-forming region 52 on the left side in the second memory cell MC2 corresponds to the second element-forming region 52 at the center. Accordingly, parts having the same functions will be indicated using the same reference numbers, and their detailed description will not be duplicated for sake of brevity.

2.A.2.a.iii. The Second Element-Forming Region on the Right Side

In terms of layout and function, the second element-forming region 52 on the right side in the second memory cell MC2 corresponds to the second element-forming region 52 at the center. Accordingly, parts having the same functions will be indicated using the same reference numbers, and their detailed description will be not be duplicated.

2.A.2.b. Second Element-Forming Region in Third and Fourth Memory Cells

In terms of layout and function, the second element-forming region 50 (54, 55, 56) in the third and fourth memory cells MC3 and MC4 correspond to the second element-forming region 50 in the first and second memory cells MC1 and MC2. In particular, the second element-forming region 54 at the center in the third and fourth memory cells MC3 and MC4 correspond to the second element-forming region 51 at the center in the first and second memory cells MC1 and MC2 in terms of layout and function. Also, the second element-forming region 55 on the left side in the third and fourth memory cells MC3 and MC4 correspond to the second element-forming region 52 on the left side in the first and second memory cells MC1 and MC2 in terms of layout and function. Also, the second element-forming region 56 on the right side in the third and fourth memory cells MC3 and MC4 correspond to the second element-forming region 53 on the right side in the first and second memory cells MC1 and MC2 in terms of layout and function. Accordingly, parts having the same functions will be indicated using the same reference numbers, and their detailed description will not be duplicated.

2.B. First Conductive Layer

The first conductive layer will be described below with reference to FIG. 3 and FIG. 7.

The conductive layer can be formed on a semiconductor substrate, and includes a first gate-gate electrode layer 60, a second gate-gate electrode layer 62, a first gate-drain wiring layer 70, and auxiliary word lines (first and second auxiliary word lines 64 and 66).

The first gate-gate electrode layer 60, the second gate-gate electrode layer 62 and the first gate-drain wiring layer 70 can be formed in each of the memory cells MC1–MC4.

The first gate-gate electrode layer 60 and the second gate-gate electrode layer 62 can be formed in a manner to extend along the Y direction. The first gate-drain wiring layer 70 can be formed to extend along the X direction.

The first and second auxiliary word lines 64 and 66 can be formed to extend along the X direction. The first auxiliary word line 64 can be formed to cross the first memory cell MC1 and the second memory cell MC2. The second auxiliary word line 66 can be formed to cross the third memory cell MC3 and the fourth memory cell MC4.

Each of the components of the first conductive layer will now be described in greater detail below.

2.B.1. Auxiliary Word Line

As shown in FIG. 7, the first auxiliary word line 64 and the second auxiliary word line 66 can be formed to cross the first element-forming region 40, respectively. The first auxiliary word line 64 functions as a gate electrode of the transfer transistors Q1 and Q2 in the first and second memory cells MC1 and MC2. The second auxiliary word line 66 functions as a gate electrode of the transfer transistors Q1 and Q2 in the third and fourth memory cells MC3 and MC4.

Positional relations between the first auxiliary word line 64 and the impurity layers formed in the first element-forming region 40 will now be described with reference to FIG. 7.

The first auxiliary word line 64 can be formed in a manner to pass between the third n⁺-type impurity layer 3a and the seventh n⁺-type impurity layer 7a, between the first n⁺-type impurity layer 1a and the first p⁺-type impurity layer 1b, and between the fifth n⁺-type impurity layer 5a and the eighth n⁺-type impurity layer 8a.

The second auxiliary word line 66 can be formed in a manner to pass between the fourth n⁺-type impurity layer 4a and the seventh n⁺-type impurity layer 7a, between the second n⁺-type impurity layer 2a and the first p⁺-type impurity layer 1b, and between the sixth n⁺-type impurity layer 6a and the eighth n⁺-type impurity layer 8a.

2.B.2 Gate-Gate Electrode Layer

The gate-gate electrode layers 60 and 62 can be now be described below with reference to FIG. 7. The first gate-gate electrode layer 60 and the second gate-gate electrode layer 62 can be formed in each of the memory cells MC1–MC4.

The first gate-gate electrode layer 60 functions as a gate electrode of the load transistor Q5 and the driver transistor Q3. The second gate-gate electrode layer 62 functions as a gate electrode of the load transistor Q6 and the driver transistor Q4.

In each of the memory cells MC1–MC4, the first gate-gate electrode layer 60 can be formed to cross the first element-forming region 40 and the second element-forming region 50. In particular, the first gate-gate electrode layer 60 can be formed in a manner to pass between the source of the first load transistor Q5 (the second p⁺-type impurity layer 2b) and the drain of the first load transistor Q5 (the fourth p⁺-type impurity layer 4b). The first gate-gate electrode layer 60 can be also formed to pass between the source of the first driver transistor Q3 (the first n⁺-type impurity layer 1a) and the drain of the first driver transistor Q3 (the fifth n⁺-type impurity layer 5a).

In each of the memory cells MC1–MC4, the second gate-gate electrode layer 62 can be formed to cross the first element-forming region 40 and the second element-forming region 50. The second gate-gate electrode layer 62 can be formed to pass between the source of the second load transistor Q6 (the second p⁺-type impurity layer 2b) and the drain of the second load transistor Q6 (the third p⁺-type impurity layer 3b). Also, the second gate-gate electrode layer 62 can be formed to pass between the source of the second driver transistor Q4 (the first n⁺-type impurity layer 1a) and the drain of the second driver transistor Q4 (the third n⁺-type impurity layer 3a).

2.B.3 First Gate-Drain Wiring Layer

In each of the memory cells MC1–MC4 shown in FIG. 7, the first gate-drain wiring layer 70 can be formed to extend from a side section of the first gate-gate electrode layer 60 toward the second gate-gate electrode layer 62 in the X direction. Also, the first gate-drain wiring layer 70 can be formed between the first element-forming region 40 and the second element-forming region 50.

2.B.4 Cross-Sectional Structure of First Conductive Layer

Referring to FIGS. 12–14, a cross-sectional structure of the first conductive layer will now be described below.

The first conductive layer may be formed by successively depositing, for example, polysilicon layers and silicide layers.

Also, an interlayer dielectric layer 130 can be formed on the first conductive layer, for example, through a planarization process utilizing, for example, a chemical mechanical polishing method.

2.C. Second Conductive Layer

The second conductive layer will be described below with reference to FIG. 4, FIG. 8, FIG. 9, and FIGS. 12–14.

The second conductive layer includes, as shown in FIG. 4, a first drain-drain wiring layer 80, a second drain-drain wiring layer 82, a lower layer 72a of the second drain-gate wiring layer, a first BL contact pad layer 110a, a first /BL contact pad layer 112a, a first Vss contact pad layer 114a and a Vdd contact pad layer 116. The second conductive layer can be formed over the interlayer dielectric layer 130 (see FIGS. 12–14).

The first drain-drain wiring layer 80, the second drain-drain wiring layer 82, the lower layer 72a of the second drain-gate wiring layer, the first BL contact pad layer 110a, the first /BL contact pad layer 112a, the first Vss contact pad layer 114a and the Vdd contact pad layer 116 can be formed in a manner to extend along the Y direction.

The first drain-drain wiring layer 80, the second drain-drain wiring layer 82 and the lower layer section 72a of the second drain-gate wiring layer can be formed in each of the memory cells MC1–MC4. In each of the memory cells MC1–MC4, the first drain-drain wiring layer 80, the second drain-drain wiring layer 82 and the lower layer section 72a of the second drain-gate wiring layer can be successively disposed in the X direction.

Components of the second conductive layer will now be described in greater detail below.

2.C.1 First Drain-Drain Wiring Layer

The first drain-drain wiring layer 80, as shown in FIG. 8, can be formed to extend from an area over the drain of the first load transistor Q5 (the fourth $p^+$-type impurity layer 4b) to an area over the drain of the first driver transistor Q3 (the fifth $n^+$-type impurity layer 5a).

The first drain-drain wiring layer 80 can be electrically connected at one end thereof to the drain of the first load transistor Q5 (the fourth $p^+$-type impurity layer 4b) through a contact section 120. Herein below, the contact section 120 that electrically connects an impurity layer and the second conductive layer can be called a "field/second-layer contact section". The first drain-drain wiring layer 80 can be electrically connected at the other end thereof to the drain of the first driver transistor Q3 (the fifth $n^+$-type impurity layer 5a) through the field/second-layer contact section 120.

2.C.2 Second Drain-Drain Wiring Layer

The second drain-drain wiring layer 82, as shown in FIG. 8, can be formed to extend from an area over the drain of the second load transistor Q6 (the third $p^+$-type impurity layer 3b) to an area over the drain of the second driver transistor Q4 (the third $n^+$-type impurity layer 3a).

The second drain-drain wiring layer 82 can be electrically connected at one end thereof to the drain of the second load transistor Q6 (the third $p^+$-type impurity layer 3b) through the field/second-layer contact section. The second drain-drain wiring layer 82 can be electrically connected at the other end thereof to the drain of the second driver transistor Q4 (the third $n^+$-type impurity layer 3a) through the field/second-layer contact section 120.

In each of the memory cells MC1–MC4, the second drain-drain wiring layer 82 has a portion, as viewed in a plan view, that overlaps the first drain-gate wiring layer 70 of the first conductive layer. The second drain-drain wiring layer 82 can be electrically connected to the first drain-gate wiring layer 70 through a contact section 122. Hereinafter, the contact section 122 that electrically connects the first conductive layer and the second conductive layer can be referred to as a "first-layer/second-layer contact section". By this, the first gate-gate electrode layer 60 of the first conductive layer and the second drain-drain wiring layer 82 can be electrically connected through the first gate-drain wiring layer 70 and the first-layer/second-layer contact section 122.

2.C.3 Lower Layer of Second Drain-Gate Wiring Layer

In each of the memory cells MC1–MC4, the lower layer 72a of the second drain-gate wiring layer has a portion, as viewed in a plan view shown in FIG. 9, that overlaps the second gate-gate electrode layer 62. The lower layer 72a of the second drain-gate wiring layer can be electrically connected to the second gate-gate electrode layer 62 through the first-layer/second-layer contact section 122.

2.C.4 First Vss Contact Pad Layer

The first Vss contact pad layer 114a can be formed, as shown in FIG. 8 and FIG. 14, over the fourth active region 40d in the first element-forming region 40. The first Vss contact pad layer 114a can be formed in a manner to be shared among four memory cells. The first Vss contact pad layer 114a can be electrically connected to the first $n^+$-type impurity layer 1a, the first $p^+$-type impurity layer 1b, and the second $n^+$-type impurity layer 2a through the field/second-layer contact section 120, respectively.

2.C.5 First BL Contact Pad Layer

The first BL contact pad layer 110a can be formed, as shown in FIG. 8, over the fifth active region 40e in the first element-forming region 40. Also, the first BL contact pad layer 110a can be formed to cross the boundary line B10 that extends in the X direction. In other words, the BL contact pad layer 110a can be shared by two adjacent memory cells arranged next to each other in the Y direction. The BL contact pad layer 110a can be electrically connected to the source or drain of the first transfer transistor Q1 (the eighth $n^+$-type impurity layer 8a) through the field/second-layer contact section 120.

2.C.6 First /BL Contact Pad Layer

The first /BL contact pad layer 112a can be formed, as shown in FIG. 8, over the third active region 40c. Also, the first /BL contact pad layer 112a can be formed to cross the boundary line B10 that extends in the X direction. In other words, the /BL contact pad layer 112a can be shared by two adjacent memory cells arranged next to each other in the Y direction. The /BL contact pad layer 112a can be electrically connected to the source or drain of the second transfer transistor Q2 (the seventh $n^+$-type impurity layer 7a) through the field/second-layer contact section 120.

2.C.7 Vdd Contact Pad Layer

The Vdd contact pad layer 116 can be formed, as shown in FIG. 8, over the seventh active region 50b in the second element-forming region 50. The Vdd contact pad layer 116 can be formed to cross the boundary line B20 that extends in the Y direction. In other words, the Vdd contact pad layer 116 can be shared by two adjacent memory cells arranged next to each other in the X direction. The Vdd contact pad layer 116 can be electrically connected to the source of the load transistors Q5 and Q6 (the second p⁺-type impurity layer 2*b*) through the field/second-layer contact section 120.

2.C.8 Cross-Sectional Structure of Second Conductive Layer

Next, a cross-sectional structure of the second conductive layer will be described with reference to FIGS. 12–14.

The second conductive layer may be formed from, for example, only a layer of nitride of a high melting point metal. The thickness of the second conductive layer may be, for example, 100–200 nm, and more preferably 140–160 nm. The layer of nitride of a high melting point metal may be formed from, for example, titanium nitride. Because the second conductive layer can be formed from a layer of nitride of a high melting point metal, the thickness of the second conductive layer can be made smaller, and miniature processing thereof can be readily conducted. Accordingly, the cell area can be reduced.

Also, the second conductive layer may be composed, for example, in either one of the following embodiments. 1) It may have a structure in which a layer of nitride of a high melting point metal can be formed on a metal layer formed from a high melting point metal. In this case, the metal layer formed from a high melting point metal can be an underlayer, and may be composed of a titanium layer, for example. Titanium nitride may be listed as a material of the layer of nitride of a high melting point metal. 2) The second conductive layer may be composed only of a metal layer of a high melting point metal.

Next, a cross-sectional structure of the field/second-layer-contact section 120 will now be described with reference to FIGS. 12–14. The field/second-layer contact section 120 can be formed to fill a through hole 130*a* that can be formed in the interlayer dielectric layer 130. The field/second-layer-contact section 120 includes a barrier layer 120*a*, and a plug 120*b* formed over the barrier layer 120*a*. Titanium and tungsten can be examples of materials used to form plugs 120*b*. The barrier layer 120*a* may preferably be formed from a metal layer of a high melting point metal, and a layer of nitride of a high melting point metal formed over the metal layer. For example, titanium may be used as material of the metal layer of a high melting point metal. Titanium nitride, for example, may be used as material of the layer of nitride of a high melting point metal.

A cross-sectional structure of the first-layer/second-layer contact section 122 can be shown in FIG. 12 and FIG. 13. The first-layer/second-layer contact section 122 can be formed to fill a through hole 130*b* that can be formed in the interlayer dielectric layer 130.

The first-layer/second-layer contact section 122 may have the same structure as that of the field/second-layer contact section 120 that will be described above.

An interlayer dielectric layer 132 can be formed over the second conductive layer. The interlayer dielectric layer 132 may be formed through a planarization process using, for example, a chemical mechanical polishing method.

2.D. Third Conductive Layer

The third conductive layer will be described below with reference to FIG. 4, FIG. 10, FIG. 9, and FIGS. 12–14.

The third conductive layer includes, as shown in FIG. 5, an upper layer section 72*b* of the second gate-drain wiring layer, a main word line 90, a Vdd line 92, a second BL contact pad layer 110*b*, a second /BL contact pad layer 112*b*, and a second Vss contact pad layer 114. The third conductive layer can be formed over the interlayer dielectric layer 132 (see FIGS. 12–14).

The upper layer section 72*b* of the second gate-drain wiring layer, the main word line 90 and the Vdd wiring 92 can be formed to extend along the X direction. The second BL contact pad layer 110*b*, the second /BL contact pad layer 112*b*, and the second Vss contact pad layer 114 can be formed to extend along the Y direction.

Each of the components of the third conductive layer can be concretely described below.

2.D.1 Upper Layer of Second Gate-Drain Wiring Layer

The upper layer 72*b* of the second gate-drain wiring layer can be formed, as shown in FIG. 5, in each of the memory cells. The upper layer section 72*b* of the second gate-drain wiring layer is, as shown in FIG. 10, can be formed to cross the second drain-drain wiring layer 82 of the second conductive layer. In particular, the upper layer section 72*b* of the second gate-drain wiring layer can be formed to extend from an area over one end section of the first drain-drain wiring layer 80 to an area over one end section of the lower layer section 72*a* of the second gate-drain wiring layer.

The upper layer section 72*b* of the second gate-drain wiring layer can be electrically connected at one end thereof to one end of the first drain-drain wiring layer 80 through the contact section 124. As used herein, the contact section 124 that electrically connects the second conductive layer and the third conductive layer can be called a "second-layer/third-layer contact section". Also, the upper layer section 72*b* of the second gate-drain wiring layer can be electrically connected at the other end thereof to one end of the lower layer section 72*b* of the second drain-gate wiring layer through the second-layer/third-layer contact section.

As shown in FIG. 1, the first drain-drain wiring layer 80 of the second conductive layer and the second gate-gate electrode layer 62 of the first conductive layer can be electrically connected through the second-layer/third-layer contact section 124, the upper layer section 72*b* of the second gate-drain wiring layer, the second-layer/third-layer contact section 124, the lower layer section 72*a* of the second gate-drain wiring layer, and the first-layer/second-layer contact section 122.

2.D.2 Vdd Wiring

The Vdd wiring 92 can be formed, as shown in FIG. 10, to pass over the Vdd contact pad layer 116. The Vdd wiring 92 can be shared by two adjacent memory cells arranged next to each other in the Y direction. The Vdd wiring 92 can be electrically connected to the Vdd contact pad layer 116 through the second-layer/third-layer contact section 124.

2.D.3 Second BL Contact Pad Layer

The second BL contact pad layer 110*b* can be located, as shown in FIG. 10, above the first BL contact pad layer 110*a*. The second BL contact pad layer 110*b* can be electrically connected to the first BL contact pad layer 110*a* through the second-layer/third-layer contact section 124.

2.D.4 Second /BL Contact Pad Layer

The second /BL contact pad layer 112*b* can be located, as shown in FIG. 10, above the first /BL contact pad layer 112*a*. The second /BL contact pad layer 112*b* can be electrically connected to the first /BL contact pad layer 112*a* through the second-layer/third-layer contact section 124.

2.D.5 Second Vss Contact Pad Layer

The second Vss contact pad layer 114*b* can be located, as shown in FIG. 10, above the first Vss contact pad layer 114*a*. The second Vss contact pad layer 114*b* can be electrically connected to the first Vss contact pad layer 114*a* through the second-layer/third-layer contact section 124.

2.D.6 Cross-Sectional Structure of Third Conductive Layer

Next, a cross-sectional structure of the third conductive layer will be described with reference to FIGS. 12–14.

The third conductive layer has a structure in which, for example, a layer of nitride of a high melting point metal, a metal layer, and a layer of nitride of a high melting point metal, in this order from the bottom, can be successively stacked in layers. For example, titanium nitride may be implemented as material of the layer of nitride of a high melting point metal. Aluminum, copper or an alloy of these metals, for example, may be implemented as material of the metal layer.

Next, a cross-sectional structure of the second-layer/third-layer contact section 124 can be now be described with reference to FIGS. 12–14. The second-layer/third-layer contact section 124 can be formed in a manner to fill a through hole 132a formed in the interlayer dielectric layer 132. The second-layer/third-layer contact section 124 may be provided with the same structure, for example, as that of the field/second-layer contact section 120 described above.

An interlayer dielectric layer 134 can be formed to cover the third conductive layer. The interlayer dielectric layer 134 may be formed through a planarization process using, for example a chemical mechanical polishing method.

2.E. Fourth Conductive Layer

The fourth conductive layer can be now be described below with reference to FIG. 6 and FIGS. 11–14.

The fourth conductive layer includes, as shown in FIG. 6, a bit line 100, a /bit line 102 and a Vss wiring 104. The fourth conductive layer can be formed over the interlayer dielectric layer 134 (see FIGS. 12–14). The bit line 100, the /bit line 102 and the Vss wiring 104 can be formed in a manner to extend along the Y direction.

Each of the components of the fourth conductive layer will be described in greater detail below.

2.E.1 Bit Line

The bit line 100 can be formed, as shown in FIG. 11, to pass over the second BL contact pad layer 110b. The bit line 100 can be electrically connected to the second BL contact pad layer 110b through a contact section 126. Herein below, the contact section 126 that electrically connects the third conductive layer and the fourth conductive layer can be called a "third-layer/fourth-layer contact section".

2.E.2 /Bit Line

The /bit line 102 can be formed to pass over the second /BL contact pad layer 112b. The /bit line 102 can be electrically connected to the /second BL contact pad layer 112b through the third-layer/fourth-layer contact section 126.

2.E.3 Vss Wiring

The Vss wiring 104 can be formed to pass over the second Vss contact pad layer 114b. The Vss wiring 104 can be shared by two adjacent memory cells arranged next to each other in the X direction. The Vss wiring 104 can be electrically connected to the second Vss contact pad layer 114b through the third-layer/fourth-layer contact section 126.

2.E.4 Cross-Sectional Structure of Fourth Conductive Layer

The fourth conductive layer may have the same structure as the structure of the third conductive layer described above.

The third-layer/fourth-layer contact section 126 can be formed, as shown in FIGS. 12–14, to fill a through hole 134a that can be formed in the interlayer dielectric layer 134. The third-layer/fourth-layer contact section 126 may have the same structure as the structure of the field/second-layer contact section 120 described above.

Although not shown in FIGS. 12–14, a passivation layer may be formed on the fourth conductive layer.

3. Comparison Example

Aspects of semiconductor devices in accordance with this embodiment of the invention will now be described below by comparing a conventional semiconductor device to an embodiment of the present invention.

Figure 18:
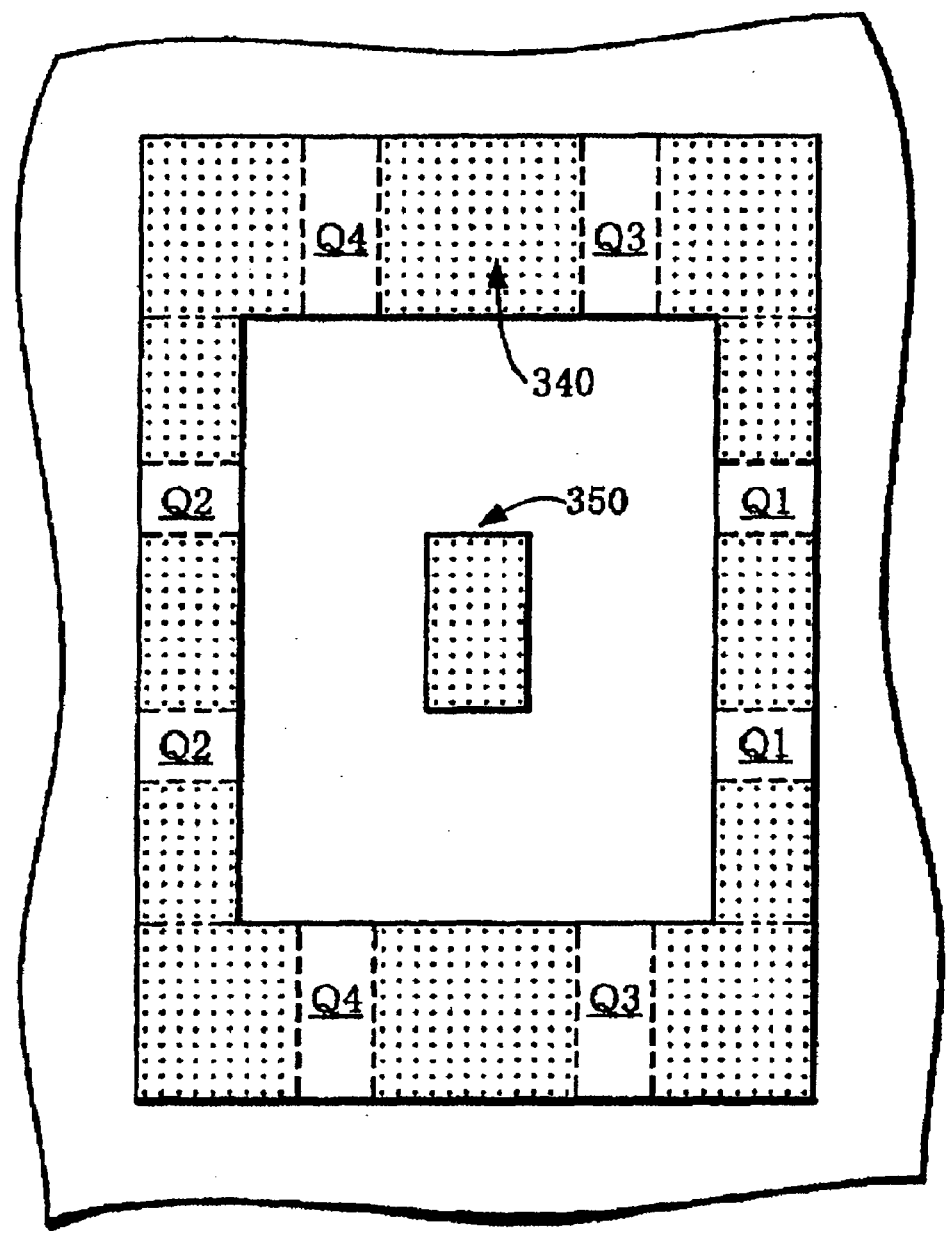
FIG. 18 is a plan view schematically showing a plane of a element-forming region in a comparison example.

Shown in FIG. 18 is one example of a conventional semiconductor device in which the element-forming region 340 for the driver transistors Q3 and Q4 and the transfer transistors Q1 and Q2, and the element-forming region 350 for the p-well contact region were formed separated from one another. The element-forming region 350 for the p-well contact region were formed such that they are isolated from one another. When the element-forming region 350 for the p-well contact region were formed isolated, patterning to form the element-forming region 350 for the p-well contact region can be difficult due to the approximation effect. More specifically, the plan configuration of the element-forming region 350 for the p-well contact region is rounded. Therefore, when the element-forming region 350 for the p-well contact region is isolated, it can be difficult to form the element-forming region 350 for the p-well contact region in a desired configuration. As a result, forming element-forming regions in the p-well could be difficult.

By contrast, as shown in FIG. 2, in the present embodiment the p-well contact region can be formed in the fourth active region 40d. The fourth active region 40d is continuous with the first active region 40a and the second active region 40b, and the element-forming region for the p-well contact region is not isolated. Accordingly, the first element-forming region 40 in the p-well can be readily patterned, thereby allowing the first element-forming region 40 to be readily formed into a desired configuration.

As shown in FIG. 14, in the present embodiment, the $p^+$-type impurity layer 1b that functions as a p-well contact region can be electrically connected to the Vss wiring 104 through the field/first-layer contact conductive section 120, the first Vss contact pad layer 114a, the second-layer/third-layer contact conductive section 124, the second Vss contact pad layer 114b and the third-layer/fourth-layer contact conductive section 126. For this reason, the well potential of the p-well region W20 can be fixed at Vss. As a result, generation of latch up can be suppressed.

Also, in the present embodiment, the p-well contact region (the first $p^+$-type impurity layer 1b) can be formed in each of the memory cells. Thus, there is no need to form a p-well potential supply region for suppressing latch up for each unit of a predetermined number of bits. As a result, the memory chip area can be reduced.

It is also possible to form the first drain-gate wiring layer and the second drain-gate wiring layer to be located in the same conductive layer. In this case it can be difficult to reduce the cell area to small due to the high pattern density of the conductive layer where the first and second drain-gate wiring layers can be formed. However, in accordance with the present embodiment, the first drain-gate wiring layer 70 can be located in the first conductive layer. Also, the second drain-gate wiring layer has a structure that can be divided into the lower layer section 72a of the second drain-gate wiring layer and the upper layer section 72b of the second drain-gate wiring layer. The lower layer section 72a of the second drain-gate wiring layer can be located in the second conductive layer, and the upper layer section 72b of the second drain-gate wiring layer can be located in the third conductive layer. Consequently, the first drain-gate wiring layer and the second drain-gate wiring layer can be formed in different layers, respectively. Accordingly, since the first drain-gate wiring layer and the second drain-gate wiring layer is not formed in the same layer, the pattern density of the wiring layer can be reduced to small. As a result, with the memory cell according to the present embodiment, the cell area can be reduced.

4. Examples of Application of SRAM to Electronic Apparatus

Figure 16:
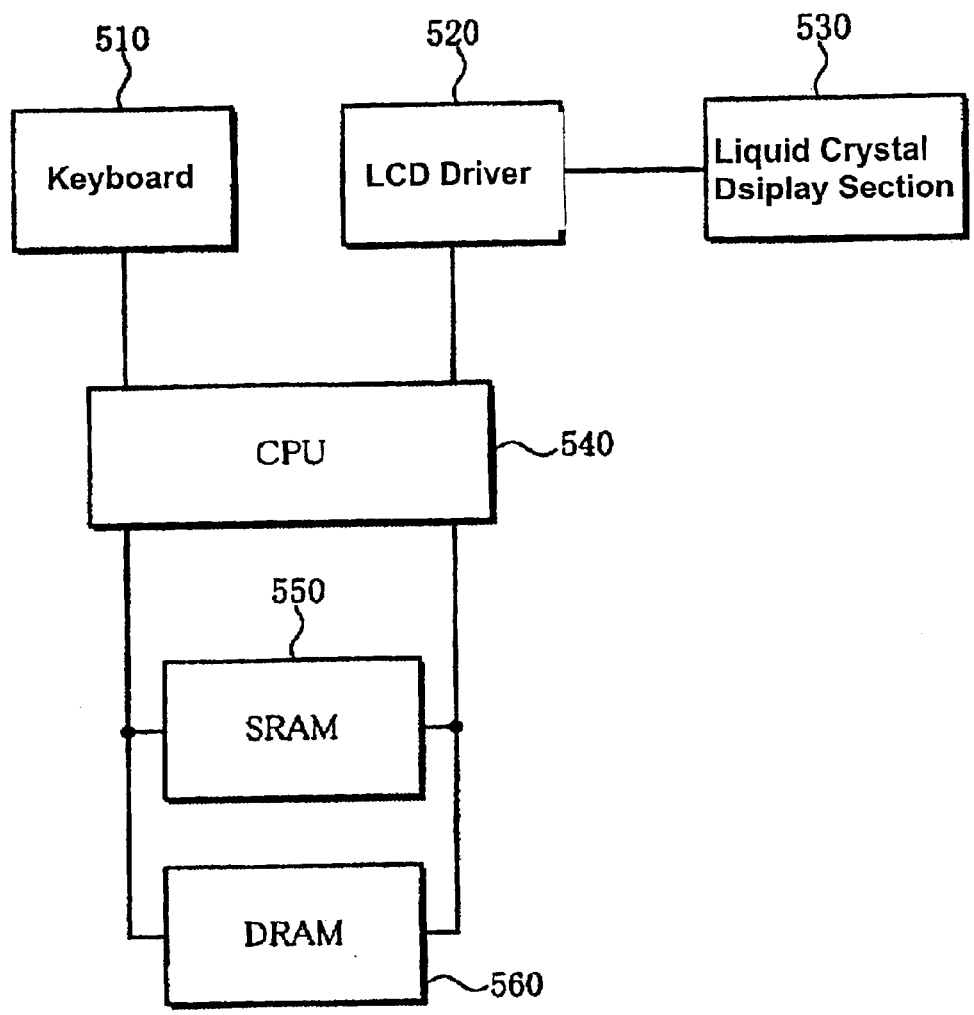
FIG. 16 shows a block diagram of a part of a mobile telephone system equipped with the SRAM in accordance with aspects of the present embodiment.

The SRAM in accordance with the present embodiment may be applied to electronic apparatuses, such as, wireless devices including, for example, wireless communicators. FIG. 16 shows a block diagram of a part of a mobile telephone system. A CPU 540, an SRAM 550 and a DRAM 560 can be mutually connected via a bus line. Further, the CPU 540 can be connected to a keyboard 510 and an LCD driver 520 via the bus line. The LCD driver 520 can be connected to a liquid crystal display section 530 via the bus line. The CPU 540, the SRAM 550 and the DRAM 560 compose a memory system.

Figure 17:
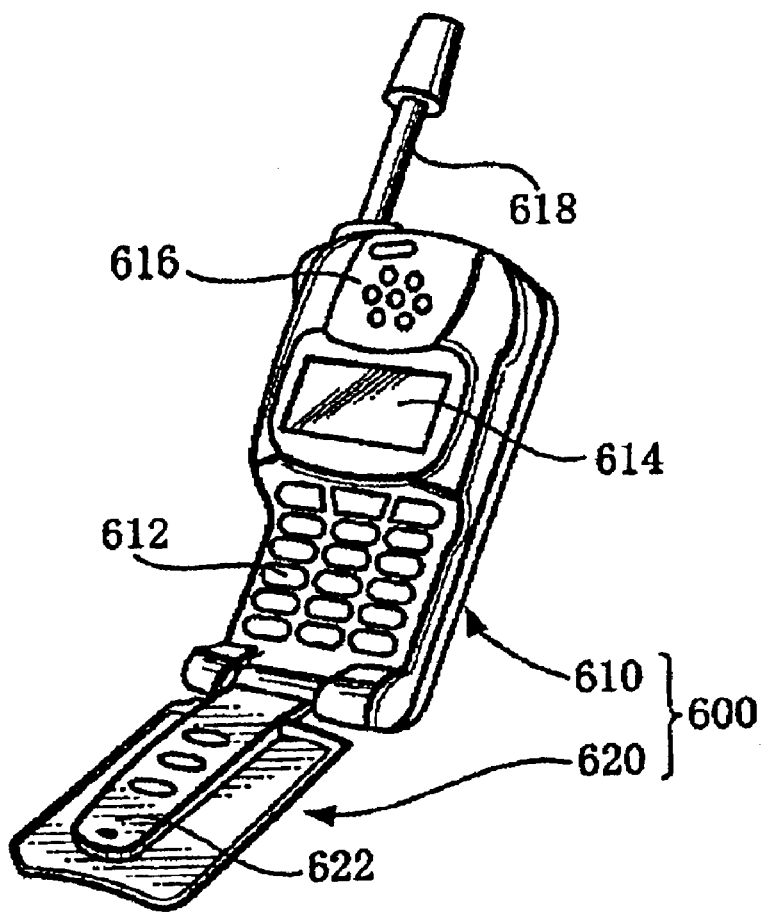
FIG. 17 shows a perspective view of a mobile telephone that is equipped with the mobile telephone system shown in FIG. 16.

FIG. 17 shows a perspective view of a mobile telephone 600 that can be equipped with, for example, the mobile telephone system shown in FIG. 16. The mobile telephone 600 can be equipped with a main body section 610 including a keyboard 612, a liquid crystal display section 614, a receiver section 616 and an antenna section 618, and a lid section 620 including a transmitter section 622.

While aspects of the present invention have been described in terms of certain preferred embodiments, those of ordinary skill in the will appreciate that certain variations, extensions and modifications may be made without varying from the basic teachings of the present invention. For example, the first element-forming region described above is also applicable, without being limited to the SRAM described above, to other SRAMs in which p-wells and auxiliary word lines extend in the same direction. As such, aspects of the present invention are not to be limited to the specific preferred embodiments described herein. Rather, the scope of the present invention is to be determined from the claims, which follow.

What is claimed is:

1. A semiconductor device equipped with a memory cell including a first load transistor, a second load transistor, a first driver transistor, a second driver transistor, a first transfer transistor, and a second transfer transistor, comprising:

a first conductivity type well region extending along a first direction;

a word line extending along the first direction over the first conductivity type well; and a first element-forming region provided in the first conductivity type well region, wherein the first element-forming region includes a first active region, a second active region, a third active region, a fourth active region, and a fifth active region, wherein the third active region, the fourth active region and the fifth active region are provided between the first active region and the second active region, and wherein the first active region and the second active region are continuous with the third active region, the fourth active region and the fifth active region, respectively, a first driver transistor in the first memory cell and a second driver transistor in the second memory cell formed in the first active region, a second driver transistor in the third memory cell and a first driver transistor in the fourth memory cell formed in the second active region, a second transfer transistor in the second memory cell and a second transfer transistor in the third memory cell formed in the third active region, and a first transfer transistor in the first memory cell and a first transfer transistor in the fourth memory cell formed in the fifth active region.

2. A semiconductor device according to claim 1, wherein the first active region and the second active region extend along the first direction, and the third active region, the fourth active region and the fifth active region extend along a second direction.

3. A semiconductor device according to claim 2, wherein the third active region, the fourth active region and the fifth active region are arranged successively in the first direction.

4. A semiconductor device according to claim 3, wherein a well contact region for the first conductivity type well region is formed in the first element-forming region.

5. A semiconductor device according to claim 3, wherein the first element-forming region is part of a first memory cell, a second memory cell, a third memory cell and a fourth memory cell.

6. A semiconductor device according to claim 4, wherein the well contact region is a second conductivity type.

7. A semiconductor device according to claim 6, wherein the first, second, third, and fifth active regions are the first conductivity type.

8. A semiconductor device according to claim 6, wherein the well contact region is part of a first memory cell, a second memory cell, a third memory cell and a fourth memory cell.

9. A semiconductor device according to claim 1, wherein the first driver transistor in the first memory cell separates a first portion of the first active region from a second portion of the first active region, wherein the second driver transistor in the second memory cell separates a third portion of the first active region from the second portion of the first active region, wherein the second driver transistor in the third memory cell separates a first portion of the second active region from a second portion of the second active region, wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

10. A semiconductor device according to claim 1, wherein the first, second, third, fourth, and fifth active regions are substantially rectangular-shaped.

11. A semiconductor device according to claim 1, wherein a well contact region for the first conductivity type well region is formed in the first element-forming region, and the well contact region is formed in the fourth active region.

12. A semiconductor device according to claim 11, further comprising:
a first source of each of the driver transistors in the first memory cell and the second memory cell, and a second source of each of the driver transistors in the third memory cell and the fourth memory cell are provided in the fourth active region, and
wherein the well contact region is provided between the first source and the second source.

13. A semiconductor device according to claim 12, wherein the well contact region, the first source and the second source are electrically connected to a Vss wiring.

14. A semiconductor device according to claim 13, wherein the word line crosses the first element-forming region.

15. A semiconductor device according to claim 14, comprising:
a first gate-gate electrode layer including a gate electrode of the first load transistor and a gate electrode of the first driver transistor;
a second gate-gate electrode layer including a gate electrode of the second load transistor and a gate electrode of the second driver transistor;
a first drain-drain wiring layer that forms a part of a connection layer that electrically connects a drain of the first load transistor and a drain of the first driver transistor;
a second drain-drain wiring layer that forms a part of a connection layer that electrically connects a drain of the second load transistor and a drain of the second driver transistor;
a first drain-gate wiring layer that forms a part of a connection layer that electrically connects the first gate-gate electrode layer and the second drain-drain wiring layer; and
a second drain-gate wiring layer that forms a part of a connection layer that electrically connects the second gate-gate electrode layer and the first drain-drain wiring layer,
wherein the first drain-gate wiring layer and the second drain-gate wiring layer are respectively located in different layers.

16. A memory system, comprising:
a semiconductor device with a memory cell including a first load transistor, a second load transistor, a first driver transistor, a second driver transistor, a first transfer transistor, and a second transfer transistor, wherein the semiconductor device further comprises:
a first conductivity type well region extending along a first direction;
a word line extending along the first direction over the first conductivity type well; and
a first element-forming region provided in the first conductivity type well region,
wherein the first element-forming region includes a first active region, a second active region, a third active region, a fourth active region, and a fifth active region,
wherein the third active region, the fourth active region and the fifth active region are provided between the first active region and the second active region, and
wherein the first active region and the second active region are continuous with the third active region, the fourth active region and the fifth active region, respectively
a first driver transistor in the first memory cell and a second driver transistor in the second memory cell formed in the first active region,
a second driver transistor in the third memory cell and a first driver transistor in the fourth memory cell formed in the second active region,
a second transfer transistor in the second memory cell and a second transfer transistor in the third memory cell formed in the third active region, and
a first transfer transistor in the first memory cell and a first transfer transistor in the fourth memory cell formed in the fifth active region.

17. A memory system according to claim 16, wherein the first active region and the second active region extend along the first direction, and the third active region, the fourth active region and the fifth active region extend along a second direction.

18. A memory system according to claim 17, wherein the third active region, the fourth active region and the fifth active region are arranged successively in the first direction.

19. A memory system according to claim 18, wherein a well contact region for the first conductivity type well region is formed in the first element-forming region.

20. A memory system according to claim 18, wherein the first element-forming region is part of a first memory cell, a second memory cell, a third memory cell and a fourth memory cell.

21. A memory system according to claim 19, wherein the well contact region is a second conductivity type.

22. A memory system according to claim 21, wherein the first, second, third, and fifth active regions are the first conductivity type.

23. A memory system according to claim 21, wherein the well contact region is part of a first memory cell, a second memory cell, a third memory cell and a fourth memory cell.

24. A memory system according to claim 16, wherein
a well contact region for the first conductivity type well region is formed in the first element-forming region, and
the well contact region is formed in the fourth active region.

25. A memory system according to claim 24, wherein
a first source of each of the driver transistors in the first memory cell and the second memory cell, and a second source of each of the driver transistors in the third memory cell and the fourth memory cell are provided in the fourth active region, and
the well contact region is provided between the first source and the second source.

26. A memory system according to claim 25, wherein the well contact region, the first source and the second source are electrically connected to a Vss wiring.

27. A memory system according to claim 26, wherein the word line crosses the first element-forming region.

28. A memory system according to claim 27, comprising:
a first gate-gate electrode layer including a gate electrode of the first load transistor and a gate electrode of the first driver transistor;
a second gate-gate electrode layer including a gate electrode of the second load transistor and a gate electrode of the second driver transistor;
a first drain-drain wiring layer that forms a part of a connection layer that electrically connects a drain of the first load transistor and a drain of the first driver transistor;
a second drain-drain wiring layer that forms a part of a connection layer that electrically connects a drain of the second load transistor and a drain of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

29. A memory system according to claim 16, wherein the first driver transistor in the first memory cell separates a first portion of the first active region from a second portion of the first active region, wherein the second driver transistor in the second memory cell separates a third portion of the first active region from the second portion of the first active region, wherein the second driver transistor in the third memory cell separates a first portion of the second active region from a second portion of the second active region, wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

30. A memory system according to claim 16, wherein the first, second, third, fourth, and fifth active regions are substantially rectangular-shaped.

31. An electronic apparatus, comprising:

a semiconductor device having a memory cell including a first load transistor, a second load transistor, a first driver transistor, a second driver transistor, a first transfer transistor, and a second transfer transistor, the semiconductor device further comprising:

a first conductivity type well region extending along a first direction;

a word line extending along the first direction over the first conductivity type well; and a first element-forming region provided in the first conductivity type well region, wherein the first element-forming region includes a first active region, a second active region, a third active region, a fourth active region, and a fifth active region, wherein the third active region, the fourth active region and the fifth active region are provided between the first active region and the second active region, and wherein the first active region and the second active region are continuous with the third active region, the fourth active region and the fifth active region, respectively, a first driver transistor in the first memory cell and a second driver transistor in the second memory cell formed in the first active region, a second driver transistor in the third memory cell and a first driver transistor in the fourth memory cell formed in the second active region, a second transfer transistor in the second memory cell and a second transfer transistor in the third memory cell formed in the third active region, and a first transfer transistor in the first memory cell and a first transfer transistor in the fourth memory cell formed in the fifth active region.

32. An electronic apparatus according to claim 31, wherein the first active region and the second active region extend along the first direction, and the third active region, the fourth active region and the fifth active region extend along a second direction.

33. An electronic apparatus according to claim 32, wherein the third active region, the fourth active region and the fifth active region are arranged successively in the first direction.

34. An electronic apparatus according to claim 33, wherein a well contact region for the first conductivity type well region is formed in the first element-forming region.

35. An electronic apparatus according to claim 33, wherein the first element-forming region is part of a first memory cell, a second memory cell, a third memory cell and a fourth memory cell.

36. An electronic apparatus according to claim 34, wherein the well contact region is a second conductivity type.

37. An electronic apparatus according to claim 36, wherein the first, second, third, and fifth active regions are the first conductivity type.

38. An electronic apparatus according to claim 36, wherein the well contact region is part of a first memory cell, a second memory cell, a third memory cell and a fourth memory cell.

39. An electronic apparatus according to claim 31, wherein a well contact region for the first conductivity type well region is formed in the first element-forming region, and the well contact region is formed in the fourth active region.

40. An electronic apparatus according to claim 39, further comprising:

a first source of each of the driver transistors in the first memory cell and the second memory cell, and a second source of each of the driver transistors in the third memory cell and the fourth memory cell are provided in the fourth active region, and wherein the well contact region is provided between the first source and the second source.

41. An electronic apparatus according to claim 40, wherein the well contact region, the first source and the second source are electrically connected to a Vss wiring.

42. An electronic apparatus according to claim 41, wherein the word line crosses the first element-forming region.

43. An electronic apparatus according to claim 42, comprising:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-drain wiring layer that forms a part of a connection layer that electrically connects a drain of the first load transistor and a drain of the first driver transistor;

a second drain-drain wiring layer that forms a part of a connection layer that electrically connects a drain of the second load transistor and a drain of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

44. An electronic apparatus according to claim 31, wherein the first driver transistor in the first memory cell separates a first portion of the first active region from a second portion of the first active region, wherein the second driver transistor in the second memory cell separates a third portion of the first active region from the second portion of the first active region, wherein the second driver transistor in the third memory cell separates a first portion of the second active region from a second portion of the second active region, wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

45. An electronic apparatus according to claim 31, wherein the first, second, third, fourth and fifth active regions are substantially rectangular-shaped.

46. A semiconductor device including a memory cell, comprising:

a first element-forming region provided in a first conductivity type well region, wherein the first element-forming region includes a first active region, a second active region, a third active region, a fourth active region, and a fifth active region, wherein the third active region, the fourth active region and the fifth active region are provided between the first active region and the second active region, and wherein the first active region and the second active region are continuous with the third active region, the fourth active region and the fifth active region, respectively, wherein the first element-forming region is part of a first memory cell, a second memory cell, a third memory cell and a fourth memory cell, a first driver transistor in the first memory cell and a second driver transistor in the second memory cell formed in the first active region, a second driver transistor in the third memory cell and a first driver transistor in the fourth memory cell formed in the second active region, a second transfer transistor in the second memory cell and a second transfer transistor in the third memory cell formed in the third active region, and a first transfer transistor in the first memory cell and a first transfer transistor in the fourth memory cell formed in the fifth active region.

47. A semiconductor device according to claim 46, further comprising:

a word line extending along the first direction over the first conductivity type well;

wherein the first conductivity type well region extends along a first direction, and wherein the first active region and the second active region extend along the first direction, and the third active region, the fourth active region and the fifth active region extend along a second direction.

48. A semiconductor device according to claim 47, wherein the third active region, the fourth active region and the fifth active region are arranged successively in the first direction.

49. A semiconductor device according to claim 48, wherein a well contact region for the first conductivity type well region is formed in the first element-forming region.

50. A semiconductor device according to claim 48, wherein the memory cell is a first memory cell including a first load transistor, a second load transistor, a first driver transistor, a second driver transistor, a first transfer transistor, and a second transfer transistor, and wherein the first element-forming region is part of the first memory cell, a second memory cell, a third memory cell and a fourth memory cell.

51. A semiconductor device according to claim 49, wherein the well contact region is a second conductivity type.

52. A semiconductor device according to claim 51, wherein the first, second, third, and fifth active regions are the first conductivity type.

53. A semiconductor device according to claim 51, wherein the well contact region is part of a first memory cell, a second memory cell, a third memory cell and a fourth memory cell.

54. A semiconductor device according to claim 46, wherein a well contact region for the first conductivity type well region is formed in the first element-forming region, and the well contact region is formed in the fourth active region.

55. A semiconductor device according to claim 54, further comprising:

a first source of each of the driver transistors in the first memory cell and the second memory cell, and a second source of each of the driver transistors in the third memory cell and the fourth memory cell are provided in the fourth active region, and wherein the well contact region is provided between the first source and the second source.

56. A semiconductor device according to claim 55, wherein the well contact region, the first source and the second source are electrically connected to a Vss wiring.

57. A semiconductor device according to claim 56, wherein the word line crosses the first element-forming region.

58. A semiconductor device according to claim 57, comprising:
a first gate-gate electrode layer including a gate electrode of the first load transistor and a gate electrode of the first driver transistor;
a second gate-gate electrode layer including a gate electrode of the second load transistor and a gate electrode of the second driver transistor;
a first drain-drain wiring layer that forms a part of a connection layer that electrically connects a drain of the first load transistor and a drain of the first driver transistor;
a second drain-drain wiring layer that forms a part of a connection layer that electrically connects a drain of the second load transistor and a drain of the second driver transistor;
a first drain-gate wiring layer that forms a part of a connection layer that electrically connects the first gate-gate electrode layer and the second drain-drain wiring layer; and
a second drain-gate wiring layer that forms a part of a connection layer that electrically connects the second gate-gate electrode layer and the first drain-drain wiring layer,
wherein the first drain-gate wiring layer and the second drain-gate wiring layer are respectively located in different layers.

59. A semiconductor device according to claim 46, wherein the first driver transistor in the first memory cell separates a first portion of the first active region from a second portion of the first active region,
wherein the second driver transistor in the second memory cell separates a third portion of the first active region from the second portion of the first active region,
wherein the second driver transistor in the third memory cell separates a first portion of the second active region from a second portion of the second active region,
wherein the first driver transistor in the fourth memory cell separates a third portion of the second active region from the second portion of the second active region,
wherein the second transfer transistor in the second memory cell separates a first portion of the third active region from a second portion of the third active region,
wherein the second transfer transistor in the third memory cell separates the second portion of the third active region from a third portion of the third active region,
wherein the first transfer transistor in the first memory cell separates a first portion of the fifth active region from a second portion of the fifth active region,
wherein the first transfer transistor in the fourth memory cell separates the second portion of the fifth active region from a third portion of the fifth active region, and
wherein the fourth active region includes a first portion, a second portion, and a well contact region disposed between and separated from the first portion and the second portion.

60. A semiconductor device according to claim 46, wherein the first, second, third, fourth, and fifth active regions are substantially rectangular-shaped.

61. A semiconductor device equipped with a memory cell including a first load transistor, a second load transistor, a first driver transistor, a second driver transistor, a first transfer transistor, and a second transfer transistor, comprising:
a first conductivity type well region extending along a first direction;
a word line extending along the first direction over the first conductivity type well;
a first element-forming region provided in the first conductivity type well region, wherein the word line crosses the first element-forming region,
wherein the first element-forming region includes a first active region, a second active region, a third active region, a fourth active region, and a fifth active region,
wherein the third active region, the fourth active region and the fifth active region are provided between the first active region and the second active region,
wherein the first active region and the second active region are continuous with the third active region, the fourth active region and the fifth active region, respectively,
wherein the first active region and the second active region extend along the first direction, and the third active region, the fourth active region and the fifth active region extend along a second direction,
wherein the third active region, the fourth active region and the fifth active region are arranged successively in the first direction; and
a well contact region of a second conductivity type for the first conductivity type well region formed in the fourth active region, and
wherein the first, second, third and fifth active regions are of the first conductivity type.

62. A semiconductor device according to claim 61, wherein the first element-forming region is part of the first memory cell, a second memory cell, a third memory cell and a fourth memory cell.

63. A semiconductor device according to claim 62, further comprising:
a first driver transistor in the first memory cell and a second driver transistor in the second memory cell are formed in the first active region,
a second driver transistor in the third memory cell and a first driver transistor in the fourth memory cell are formed in the second active region,
a second transfer transistor in the second memory cell and a second transfer transistor in the third memory cell are formed in the third active region, and
a first transfer transistor in the first memory cell and a first transfer transistor in the fourth memory cell are formed in the fifth active region.

64. A semiconductor device according to claim 63, wherein the first driver transistor in the first memory cell separates a first portion of the first active region from a second portion of the first active region,
wherein the second driver transistor in the second memory cell separates a third portion of the first active region from the second portion of the first active region,
wherein the second driver transistor in the third memory cell separates a first portion of the second active region from a second portion of the second active region,
wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

65. A semiconductor device according to claim 63, wherein the first, second, third, fourth, and fifth active regions are substantially rectangular-shaped.

66. A semiconductor device according to claim 63, further comprising:

a first source of each of the driver transistors in the first memory cell and the second memory cell, and a second source of each of the driver transistors in the third memory cell and the fourth memory cell are provided in the fourth active region, and wherein the well contact region is provided between the first source and the second source, and wherein the well contact region, the first source and the second source are electrically connected to a Vss wiring.

67. A semiconductor device according to claim 66, comprising:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-drain wiring layer that forms a part of a connection layer that electrically connects a drain of the first load transistor and a drain of the first driver transistor;

a second drain-drain wiring layer that forms a part of a connection layer that electrically connects a drain of the second load transistor and a drain of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

68. A memory system, comprising:

a semiconductor device with a memory cell including a first load transistor, a second load transistor, a first driver transistor, a second driver transistor, a first transfer transistor, and a second transfer transistor, wherein the semiconductor device comprises:

a first conductivity type well region extending along a first direction;

a word line extending along the first direction over the first conductivity type well;

a first element-forming region provided in the first conductivity type well region, wherein the word line crosses the first element-forming region, wherein the first element-forming region includes a first active region, a second active region, a third active region, a fourth active region, and a fifth active region, wherein the third active region, the fourth active region and the fifth active region are provided between the first active region and the second active region, wherein the first active region and the second active region are continuous with the third active region, the fourth active region and the fifth active region, respectively, wherein the first active region and the second active region extend along the first direction, and the third active region, the fourth active region and the fifth active region extend along a second direction, wherein the third active region, the fourth active region and the fifth active region are arranged successively in the first direction; and a well contact region of a second conductivity type for the first conductivity type well region formed in the fourth active region, and wherein the first, second, third and fifth active regions are of the first conductivity type.

69. A memory system according to claim 68, wherein the first element-forming region is part of the first memory cell, a second memory cell, a third memory cell and a fourth memory cell.

70. A memory system according to claim 69, further comprising:

a first driver transistor in the first memory cell and a second driver transistor in the second memory cell are formed in the first active region, a second driver transistor in the third memory cell and a first driver transistor in the fourth memory cell are formed in the second active region, a second transfer transistor in the second memory cell and a second transfer transistor in the third memory cell are formed in the third active region, and a first transfer transistor in the first memory cell and a first transfer transistor in the fourth memory cell are formed in the fifth active region.

71. A memory system according to claim 70, wherein the first driver transistor in the first memory cell separates a first portion of the first active region from a second portion of the first active region, wherein the second driver transistor in the second memory cell separates a third portion of the first active region from the second portion of the first active region, wherein the second driver transistor in the third memory cell separates a first portion of the second active region from a second portion of the second active region, wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

72. A memory system according to claim 70, wherein the first, second, third, fourth, and fifth active regions are substantially rectangular-shaped.

73. A memory system according to claim 70, further comprising:

a first source of each of the driver transistors in the first memory cell and the second memory cell, and a second source of each of the driver transistors in the third memory cell and the fourth memory cell are provided in the fourth active region, and wherein the well contact region is provided between the first source and the second source, and wherein the well contact region, the first source and the second source are electrically connected to a Vss wiring.

74. A memory system according to claim 73, comprising:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-drain wiring layer that forms a part of a connection layer that electrically connects a drain of the first load transistor and a drain of the first driver transistor;

a second drain-drain wiring layer that forms a part of a connection layer that electrically connects a drain of the second load transistor and a drain of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

75. An electronic apparatus, comprising:

a semiconductor device with a memory cell including a first load transistor, a second load transistor, a first driver transistor, a second driver transistor, a first transfer transistor, and a second transfer transistor, wherein the semiconductor device comprises:

a first conductivity type well region extending along a first direction;

a word line extending along the first direction over the first conductivity type well;

a first element-forming region provided in the first conductivity type well region, wherein the word line crosses the first element-forming region, wherein the first element-forming region includes a first active region, a second active region, a third active region, a fourth active region, and a fifth active region, wherein the third active region, the fourth active region and the fifth active region are provided between the first active region and the second active region, wherein the first active region and the second active region are continuous with the third active region, the fourth active region and the fifth active region, respectively, wherein the first active region and the second active region extend along the first direction, and the third active region, the fourth active region and the fifth active region extend along a second direction, wherein the third active region, the fourth active region and the fifth active region are arranged successively in the first direction; and a well contact region of a second conductivity type for the first conductivity type well region formed in the fourth active region, and wherein the first, second, third and fifth active regions are of the first conductivity type.

76. An electronic apparatus according to claim 75, wherein the first element-forming region is part of the first memory cell, a second memory cell, a third memory cell and a fourth memory cell.

77. An electronic apparatus according to claim 76, further comprising:

a first driver transistor in the first memory cell and a second driver transistor in the second memory cell are formed in the first active region, a second driver transistor in the third memory cell and a first driver transistor in the fourth memory cell are formed in the second active region, a second transfer transistor in the second memory cell and a second transfer transistor in the third memory cell are formed in the third active region, and a first transfer transistor in the first memory cell and a first transfer transistor in the fourth memory cell are formed in the fifth active region.

78. An electronic apparatus according to claim 77, wherein the first driver transistor in the first memory cell separates a first portion of the first active region from a second portion of the first active region, wherein the second driver transistor in the second memory cell separates a third portion of the first active region from the second portion of the first active region, wherein the second driver transistor in the third memory cell separates a first portion of the second active region from a second portion of the second active region, wherein the first driver transistor in the fourth memory cell separates a third portion of the second active region from the second portion of the second active region, wherein the second transfer transistor in the second memory cell separates a first portion of the third active region from a second portion of the third active region, wherein the second transfer transistor in the third memory cell separates the second portion of the third active region from a third portion of the third active region, wherein the first transfer transistor in the first memory cell separates a first portion of the fifth active region from a second portion of the fifth active region, wherein the first transfer transistor in the fourth memory cell separates the second portion of the fifth active region from a third portion of the fifth active region, and wherein the fourth active region includes a first portion, a second portion, and a well contact region disposed between and separated from the first portion and the second portion.

79. An electronic apparatus according to claim 77, wherein the first, second, third, fourth, and fifth active regions are substantially rectangular-shaped.

80. An electronic apparatus according to claim 77, further comprising:

a first source of each of the driver transistors in the first memory cell and the second memory cell, and a second source of each of the driver transistors in the third memory cell and the fourth memory cell are provided in the fourth active region, and wherein the well contact region is provided between the first source and the second source, and wherein the well contact region, the first source and the second source are electrically connected to a Vss wiring.

81. An electronic apparatus according to claim 80, comprising:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-drain wiring layer that forms a part of a connection layer that electrically connects a drain of the first load transistor and a drain of the first driver transistor;

a second drain-drain wiring layer that forms a part of a connection layer that electrically connects a drain of the second load transistor and a drain of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first drain-gate wiring layer and the second drain-gate wiring layer are respectively located in different layers.

* * * * *